(12) United States Patent
Yu et al.

(10) Patent No.: US 9,576,910 B2
(45) Date of Patent: Feb. 21, 2017

(54) SEMICONDUCTOR PACKAGING STRUCTURE AND MANUFACTURING METHOD THEREOF

(71) Applicant: TAIWAN SEMICONDUCTOR MANUFACTURING COMPANY LTD., Hsinchu (TW)

(72) Inventors: Chen-Hua Yu, Hsinchu (TW); Ming-Da Cheng, Hsinchu (TW); Jui-Pin Hung, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 14/644,605

(22) Filed: Mar. 11, 2015

(65) Prior Publication Data

US 2016/0268214 A1    Sep. 15, 2016

(51) Int. Cl.
*H01L 23/552*    (2006.01)
*H01L 25/00*    (2006.01)
(Continued)

(52) U.S. Cl.
CPC .......... *H01L 23/552* (2013.01); *H01L 21/311* (2013.01); *H01L 21/32051* (2013.01); *H01L 21/565* (2013.01); *H01L 21/568* (2013.01); *H01L 21/6835* (2013.01); *H01L 23/3107* (2013.01); *H01L 24/02* (2013.01); *H01L 24/96* (2013.01);
(Continued)

(58) Field of Classification Search
CPC .... H01L 23/552; H01L 25/18; H01L 25/0655; H01L 24/02; H01L 21/311; H01L 21/32051; H01L 23/3107; H01L 25/50; H01L 21/565; H01L 21/6835; H01L 2224/0231; H01L 2221/6835; H01L 2224/0237
(Continued)

(56) References Cited

U.S. PATENT DOCUMENTS

2004/0172502 A1*   9/2004   Lionetta ............... H05K 9/0032
                                                                                                  711/112
2007/0246825 A1*   10/2007   Oh ....................... H01L 23/3121
                                                                                                  257/728
(Continued)

FOREIGN PATENT DOCUMENTS

JP       2008211125      9/2008
KR     100691629      3/2007

OTHER PUBLICATIONS

Office Action issued by KIPO on Dec. 14, 2016 for corresponding Korean application Sep. 5, 2016-090066835.

*Primary Examiner* — Phat X Cao
*Assistant Examiner* — Mohammad M Hogue
(74) *Attorney, Agent, or Firm* — WPAT, P.C., Intellectual Property Attorneys; Anthony King

(57) ABSTRACT

A semiconductor structure includes a plurality of devices; a molding surrounding the plurality of devices and including a first surface adjacent to an active component of at least one of the plurality of devices and a second surface opposite to the first surface; and a shielding structure disposed within the molding and between two or more of the plurality of devices, wherein the shielding structure includes a first surface adjacent to the first surface of the molding and a second surface adjacent to the second surface of the molding, and the second surface of the shielding structure includes a recessed portion recessed towards the first surface of the molding.

20 Claims, 25 Drawing Sheets

(51) Int. Cl.
*H01L 21/56* (2006.01)
*H01L 21/683* (2006.01)
*H01L 21/311* (2006.01)
*H01L 21/3205* (2006.01)
*H01L 23/31* (2006.01)
*H01L 25/065* (2006.01)
*H01L 25/18* (2006.01)
*H01L 23/00* (2006.01)

(52) U.S. Cl.
CPC .......... *H01L 25/0655* (2013.01); *H01L 25/18* (2013.01); *H01L 25/50* (2013.01); *H01L 2221/6835* (2013.01); *H01L 2224/0231* (2013.01); *H01L 2224/0237* (2013.01); *H01L 2224/04105* (2013.01); *H01L 2224/94* (2013.01); *H01L 2924/10253* (2013.01); *H01L 2924/1421* (2013.01); *H01L 2924/1438* (2013.01); *H01L 2924/15311* (2013.01); *H01L 2924/15313* (2013.01); *H01L 2924/1815* (2013.01); *H01L 2924/19041* (2013.01); *H01L 2924/19043* (2013.01); *H01L 2924/19105* (2013.01); *H01L 2924/3025* (2013.01)

(58) Field of Classification Search
USPC ........................................................ 257/659
See application file for complete search history.

(56) References Cited

U.S. PATENT DOCUMENTS

| | | |
|---|---|---|
| 2009/0072394 A1 | 3/2009 | Onodera et al. |
| 2012/0320558 A1* | 12/2012 | Foster ................. H05K 1/0218 361/818 |
| 2015/0028360 A1* | 1/2015 | Tu ........................... H01L 31/16 257/82 |

* cited by examiner

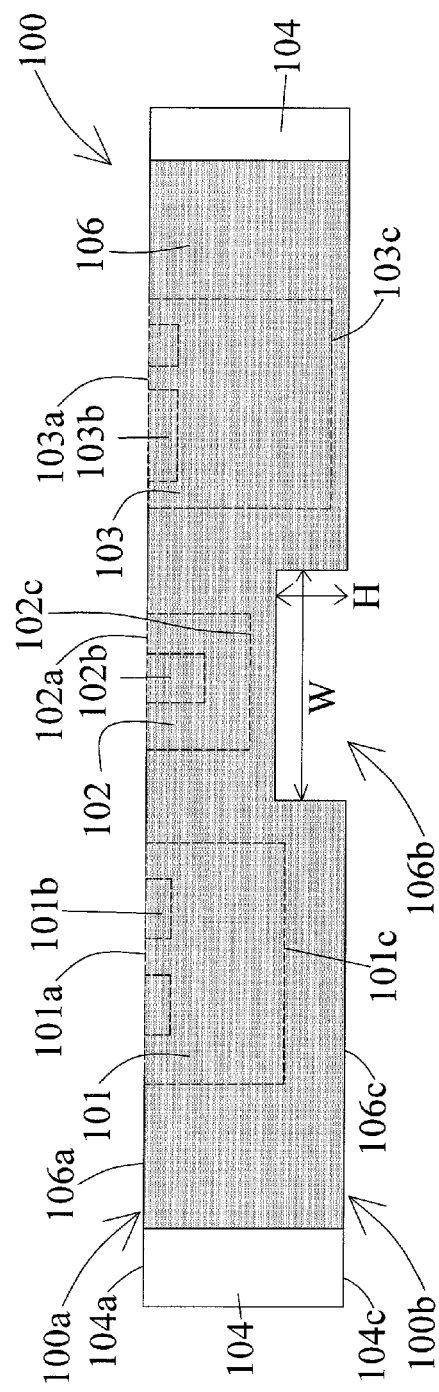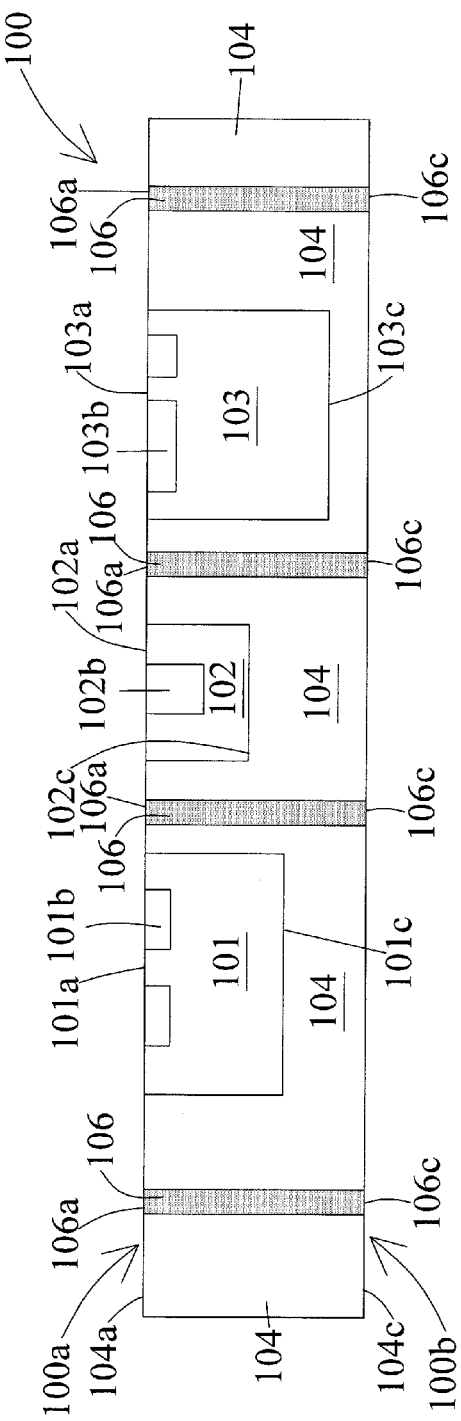

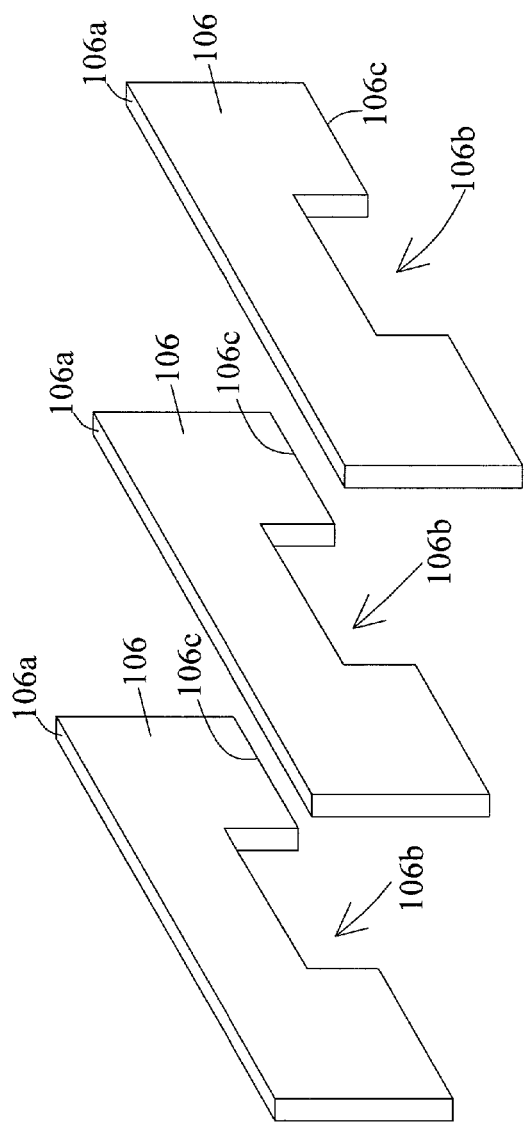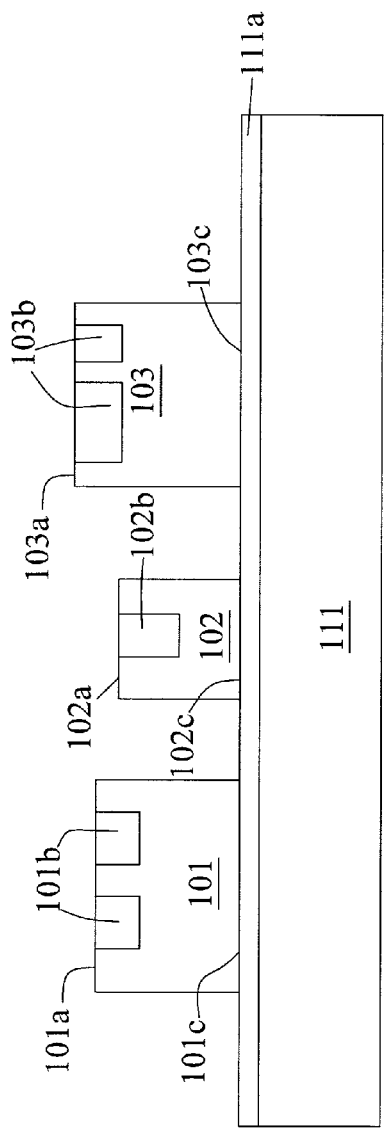
FIG. 12A
FIG. 12B

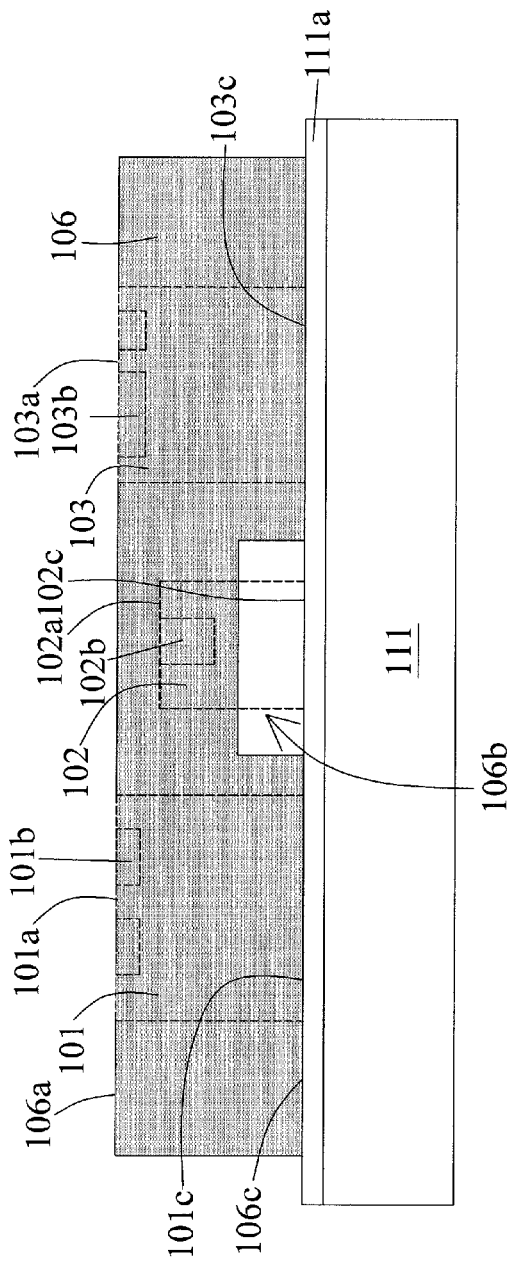
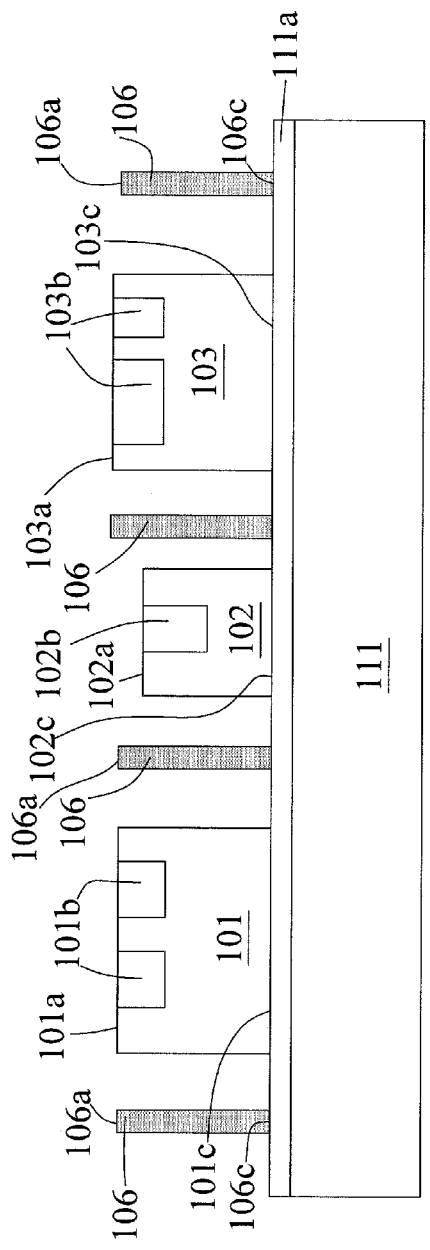
FIG. 12C
FIG. 12D

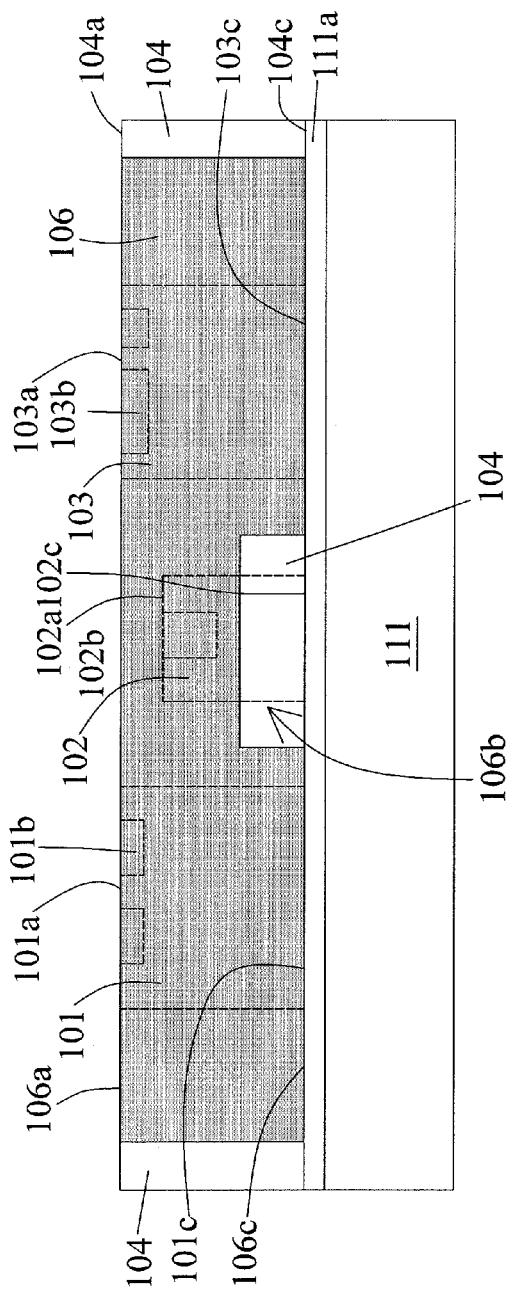
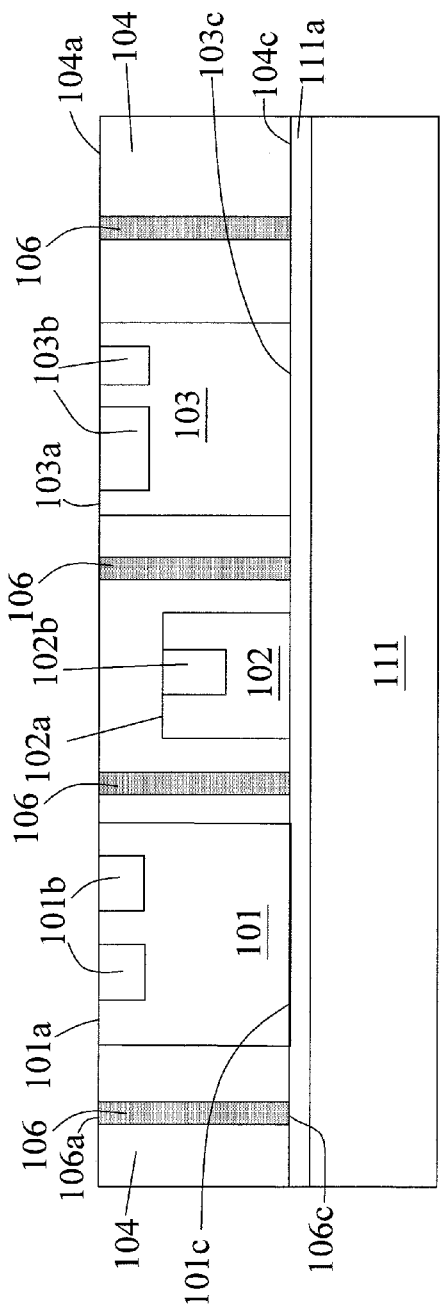
FIG. 12G
FIG. 12H

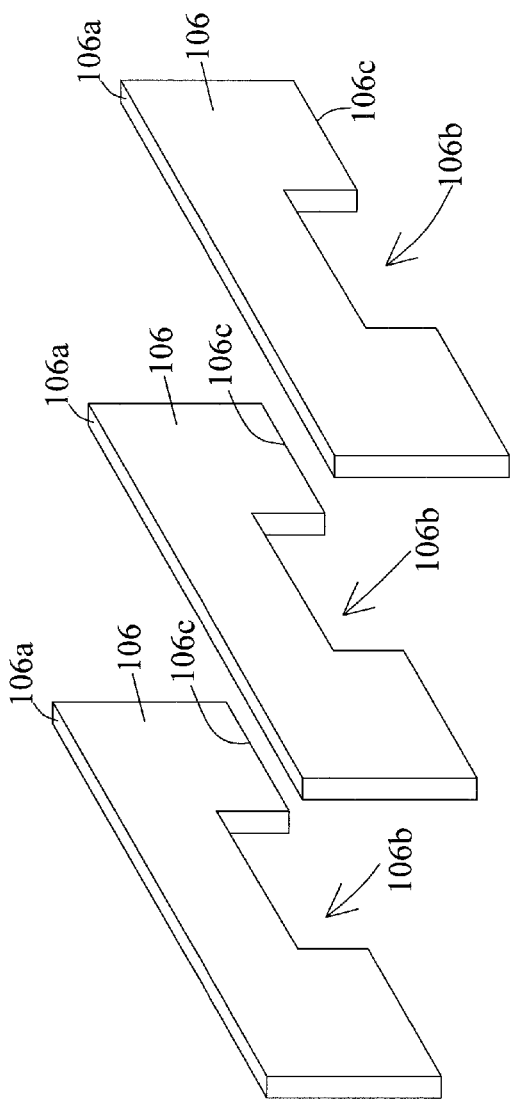
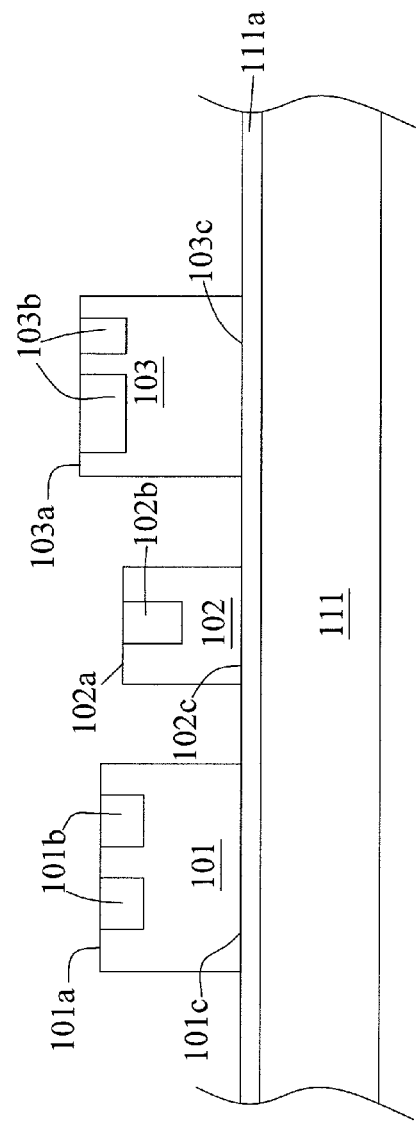
FIG. 13A
FIG. 13B

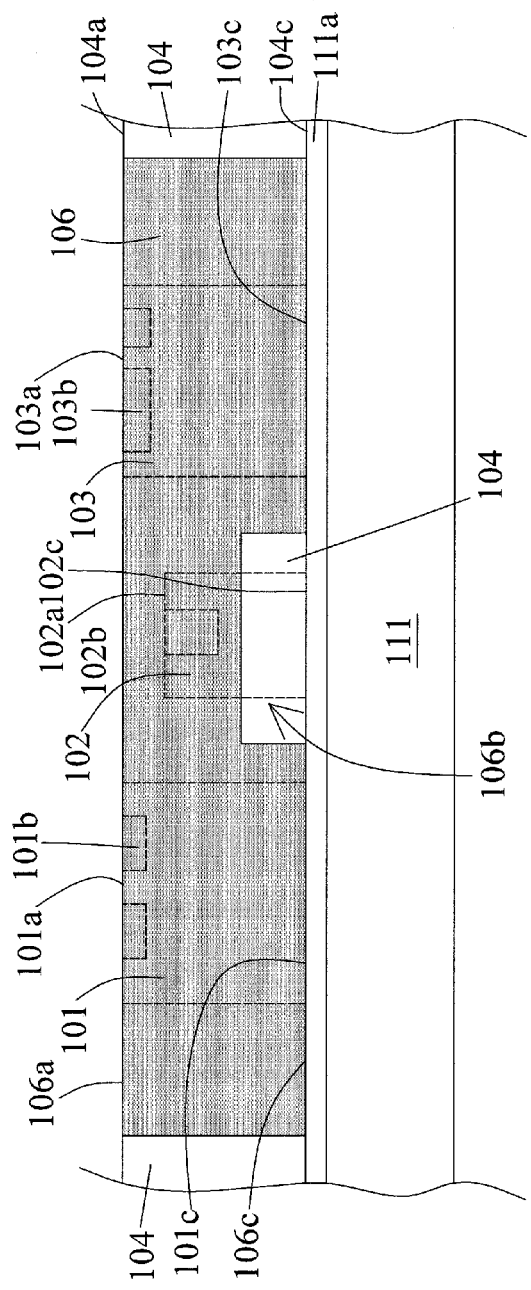
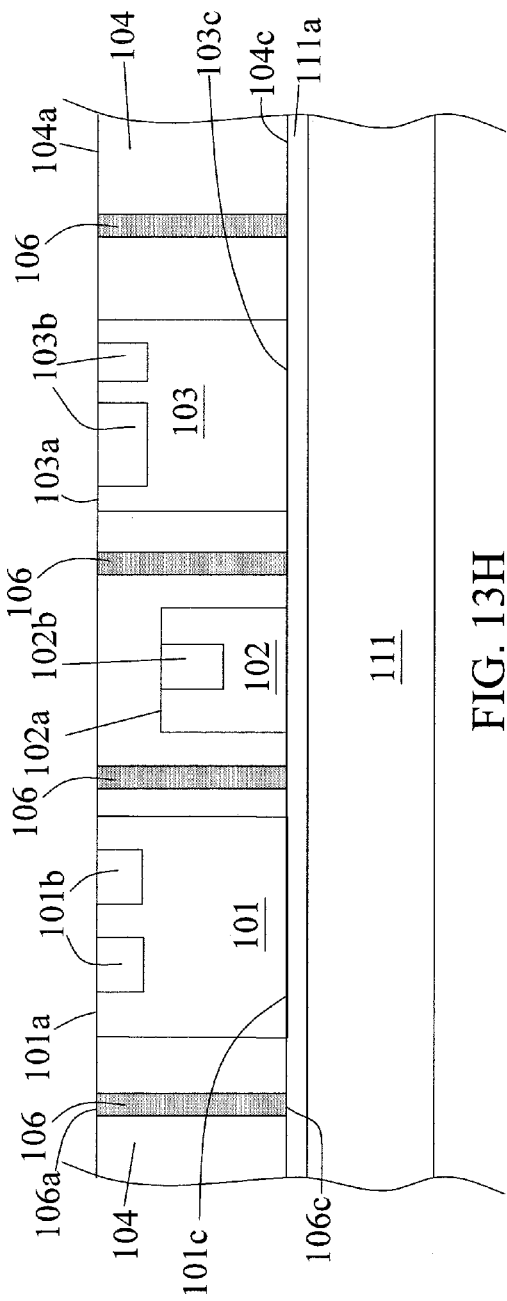
FIG. 13G
FIG. 13H

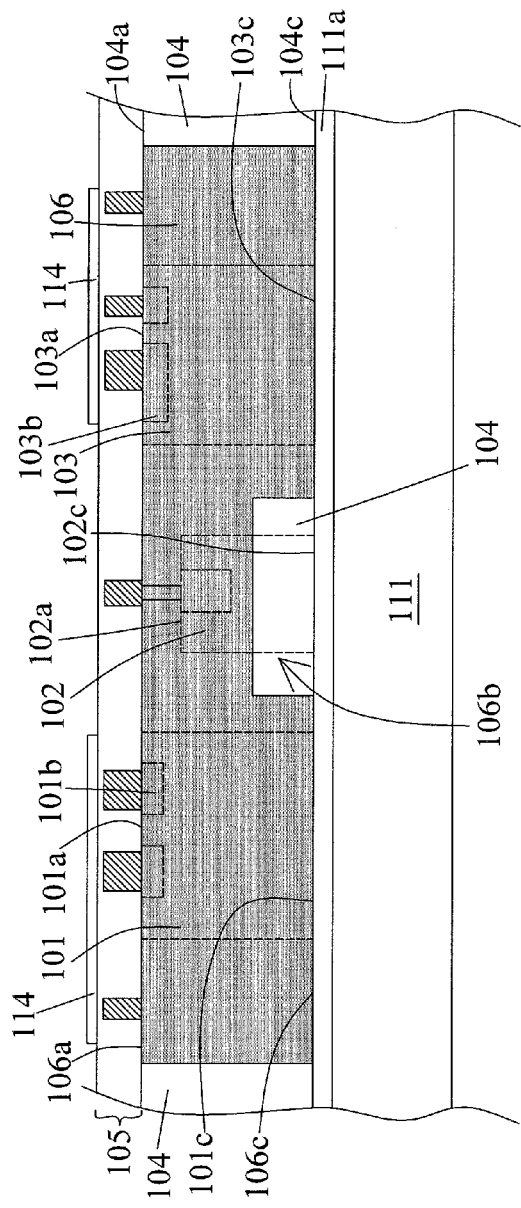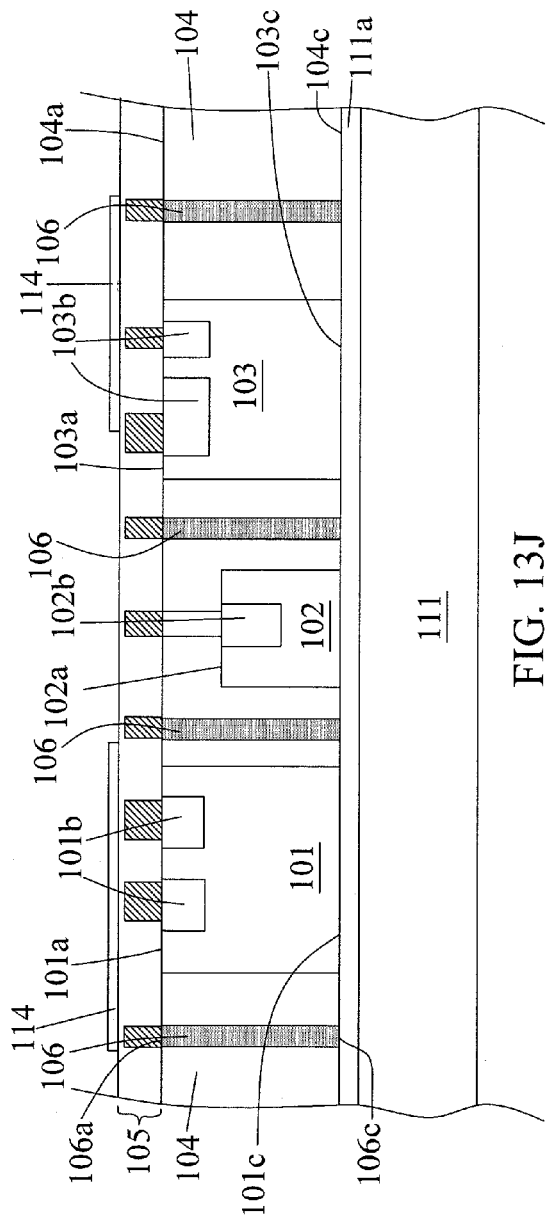

SEMICONDUCTOR PACKAGING STRUCTURE AND MANUFACTURING METHOD THEREOF

BACKGROUND

Electronic equipments using semiconductor devices are essential for many modern applications. The semiconductor devices are applied for a variety of high-density electronics applications. With the advancement of electronic technology, the electronic equipment is getting more complicated with greater functionality and greater amounts of integrated circuitry, while are becoming increasingly smaller in size. Due to the miniaturized scale of the electronic equipment, various types and dimensions of semiconductor devices performing different functionalities are integrated and packaged into a single module. Furthermore, numerous manufacturing operations are implemented for integration of various types of semiconductor devices.

However, the manufacturing and integration of the semiconductor devices involve many complicated steps and operations. The integration of the semiconductor devices in such low profile and high density becomes more complicated. An increase in a complexity of manufacturing and integration of the semiconductor devices may cause deficiencies such as contamination, poor electrical interconnection, development of cracks, delamination of the components or high yield loss.

The semiconductor devices are integrated and produced in an undesired configuration, which would further exacerbate materials wastage and thus increase the manufacturing cost. Since more different components with different materials are involved, complexity of the manufacturing and integration operations of the semiconductor devices is increased. There are more challenges to modify a structure of the semiconductor device and improve the manufacturing operations. As such, there is a continuous need to improve the manufacturing the semiconductor devices and solve the above deficiencies.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIG. 1 is a side view of a semiconductor structure in accordance with some embodiments of the present disclosure.

FIG. 2 is a front view of a semiconductor structure in accordance with some embodiments of the present disclosure.

FIG. 12A is a schematic view of a shielding structure in accordance with some embodiments of the present disclosure.

FIG. 12B is a schematic view of several devices disposed on a carrier in accordance with some embodiments of the present disclosure.

FIGS. 12C and 12D are schematic views of a shielding structure disposed on a carrier in accordance with some embodiments of the present disclosure.

FIGS. 12G and 12H are schematic views of a molding in accordance with some embodiments of the present disclosure.

FIG. 13A is a schematic view of a shielding structure in accordance with some embodiments of the present disclosure.

FIG. 13B is a schematic view of several devices disposed on a carrier in accordance with some embodiments of the present disclosure.

FIGS. 13G and 13H are schematic views of a molding in accordance with some embodiments of the present disclosure.

FIGS. 13I and 13J are schematic views of a redistribution layer (RDL) in accordance with some embodiments of the present disclosure.

DETAILED DESCRIPTION OF THE DISCLOSURE

Figure 3:
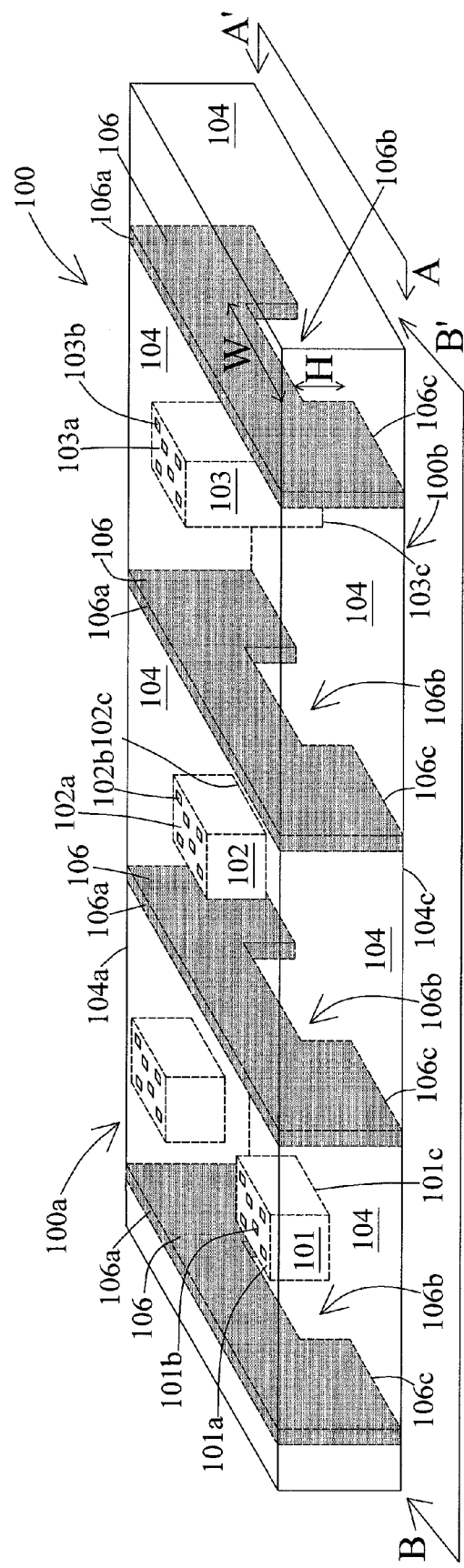
FIG. 3 is a perspective view of a semiconductor structure in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

An electronic equipment including various semiconductor devices is manufactured by a number of operations. During the manufacturing, the semiconductor devices with different functionalities and dimensions are integrated into a single system. Circuitries of the semiconductor devices are integrated and connected through conductive traces and a substrate. After integration of the semiconductor devices, the semiconductor devices are encapsulated by a mold in order to protect the semiconductor devices from damages of the circuitries and environmental contamination. However, the encapsulation of the semiconductor devices could not be formed in a desired configuration. The contamination of the semiconductor devices and delamination of components are suffered.

Further, the semiconductor devices may include some radio frequency (RF) components which require isolation from external electromagnetic interference. Also, a leakage of RF signals generated by the RF components out of the semiconductor device shall be prevented. A shielding is provided for isolating the semiconductor devices and preventing external interference and signal leakage. However, the semiconductor devices with the shielding could not be fully encapsulated, as the shielding would affect a formation of the encapsulation. As a result, the semiconductor devices could not receive optimal physical protection from the encapsulation when the semiconductor devices are isolated from external electromagnetic interference by the shielding.

In the present disclosure, an improved semiconductor structure is disclosed. The semiconductor structure includes several devices and a shielding structure configured to isolate the devices from each other and external electromagnetic interference. The shielding structure includes several recessed portions or cavities which facilitate flowing of a molding compound during transfer molding or compression molding operations. The devices are enclosed by a mold chase, and then the molding compound is flown into the mold chase to fill a space between the mold chase and the devices. The molding compound could flow through the recessed portions of the shielding structure in order to completely fill the space. The molding compound could be disposed around and between the devices.

Therefore, a molding completely encapsulated the devices could be formed. Since the shielding structure includes the recessed portions, the molding formed by the transfer molding or compression molding operations would not be affected by profiles of the devices and/or the shielding structure. Thus, the devices could be fully encapsulated by the molding, and a reliability of the semiconductor structure could be improved.

FIGS. 1-3 are an embodiment of a semiconductor structure 100. FIG. 3 is a perspective view of the semiconductor structure 100. FIG. 1 is a side view of the semiconductor structure 100 from AA' of FIG. 3. FIG. 2 is a front view of the semiconductor structure 100 from BB' of FIG. 3.

In some embodiments, the semiconductor structure 100 includes several devices (101, 102, 103), a molding 104 and a shielding structure 106. Although only three devices (101, 102, 103) are described below, the semiconductor structure 100 can include one or more devices. It is not intended to limit to three devices. Any number of devices is also fallen into our intended scope, without departing from the spirit and scope of the present disclosure.

In some embodiments, the devices (101, 102, 103) are integrated or packaged to become the semiconductor structure 100. In some embodiments, the semiconductor structure 100 is a system in package (SiP). The devices (101, 102, 103) are electrically connected. In some embodiments, the devices (101, 102, 103) include RF components and are integrated to become a radio frequency (RF) package.

In some embodiments, the semiconductor structure 100 includes a front side 100a and a back side 100b opposite to the front side 100a. In some embodiments, the front side 100a is processed for routing circuitry within the semiconductor structure 100. In some embodiments, the back side 100b does not involve the routing of the circuitry within the semiconductor structure 100.

In some embodiments, the devices (101, 102, 103) are horizontally disposed or vertically stacked. In some embodiments, the devices (101, 102, 103) involve different functionalities from each other. For example, the devices (101, 102, 103) include a processor, a flash memory, a resistor, a capacitor, etc. In some embodiments, the devices (101, 102, 103) include at least one unpackaged device and at least one packaged device. In some embodiments, the device 101 is the unpackaged device such as a bare chip or a die. In some embodiments, the devices 102 and 103 are packaged devices.

In some embodiments, the devices (101, 102, 103) include a bare chip, a die, a ball grid array (BGA) package, a quad flat no leads (QFN) package, a land grid array (LGA) package, a surface mount device (SMD), a microelectromechanical systems device (MEMS), etc. In some embodiments, the device 101 is the bare chip, the device 102 is the SMD, and the device 103 is the BGA, QFN or LGA package. In some embodiments, the device 101 is the bare chip or die which is a small piece including semiconductor materials such as silicon and is fabricated with a predetermined functional circuit therein produced by photolithography operations. In some embodiments, the device 101 is singulated from a silicon wafer by a mechanical or laser blade. In some embodiments, the device 101 is in a quadrilateral, a rectangular or a square shape.

In some embodiments, the devices (101, 102, 103) have different dimensions from each other. In some embodiments, at least one of the devices (101, 102, 103) has substantially different height from another one of the devices (101, 102, 103). In some embodiment, the device 101 has substantially smaller height than a height of the device 102 or a height of the device 103.

In some embodiments, each of the devices (101, 102, 103) includes a first surface (101a, 102a, 103a). Each of the first surfaces (101a, 102a, 103a) is disposed with several active components (101b, 102b, 103b) such as die pads, I/O pads, bond pads, conductive traces, conductive structures etc. In some embodiments, the first surface 101a of the device 101 is disposed with several die pads 101b. The first surface 102a of the device 102 is disposed with several conductive structures 102b. The first surface 103a of the device 103 is disposed with several conductive structures 103b. In some embodiments, the first surfaces (101a, 102a, 103a) are active surfaces of the devices (101, 102, 103) respectively. Each active surface of the devices (101, 102, 103) includes an active component.

In some embodiments, the die pads 101b are disposed on the first surface 101a of the device 101. In some embodiments, the die pad 101b is configured to electrically connect with a circuitry external to the device 101, so that a circuitry internal to the device 101 electrically connects with the circuitry external to the device 101 through the die pad 101b. In some embodiments, the die pad 101b includes gold, silver, copper, nickel, tungsten, aluminum, palladium and/or alloys thereof.

In some embodiments, each of the devices (101, 102, 103) includes a second surface (101c, 102c, 103c) which is opposite to the corresponding first surface (101a, 102a, 103a). In some embodiments, the second surfaces (101c, 102c, 103c) are back sides of the devices (101, 102, 103) respectively. Each back side of the devices (101, 102, 103) does not include active component.

In some embodiments, the molding 104 is disposed between the devices (101, 102, 103) and surrounds the devices (101, 102, 103). Sidewalls of the devices (101, 102, 103) are interfaced with the molding 104. In some embodiments, the devices (101, 102, 103) are horizontally arranged and supported by the molding 104.

In some embodiments, the molding 104 includes a molding compound. The molding compound can be a single layer film or a composite stack. The molding compound includes various materials, for example, one or more of epoxy resins, phenolic hardeners, silicas, catalysts, pigments, mold release agents, and the like. Each of the materials for forming a molding compound has a high thermal conductivity, a low moisture absorption rate, a high flexural strength at board-mounting temperatures, or a combination of these.

In some embodiments, the molding 104 includes a first surface 104a adjacent to the active component of at least one of the devices (101, 102, 103) and a second surface 104c opposite to the first surface 104a. In some embodiments, the first surface 104a of the molding is adjacent to at least one of the die pad 101b or conductive structures (102, 103) of the devices (101, 102, 103). In some embodiments, the first surface 104a of the molding 104 is adjacent to the first surfaces (101a, 102a, 103a) of the devices (101, 102, 103).

In some embodiments, the second surface 104c of the molding 104 is adjacent to the second surfaces (101c, 102c, 103c) of the devices (101, 102, 103).

In some embodiments, the shielding structure 106 is disposed within the molding 104 and between two or more of the devices (101, 102, 103). In some embodiments, the shielding structure 106 is extended between the front side 100a and the back side 100b of the semiconductor structure 100. In some embodiments, the shielding structure 106 is extended from the first surface 104a to the second surface 104c of the molding 104. In some embodiments, the shielding structure 106 is vertically disposed along a height of the semiconductor structure 100 and is extended along a length of the semiconductor structure 100. In some embodiments, the shielding structure 106 is supported by the molding 104. In some embodiments, the shielding structure 106 includes metal such as copper, aluminum, lead, solder, etc.

In some embodiments, the shielding structure 106 isolates the devices (101, 102, 103) from each other. The shielding structure 106 is configured to prevent leakage of signal generated from the devices (101, 102, 103) and external electromagnetic interference to the devices (101, 102, 103). Therefore, performance of the devices (101, 102, 103) would not be affected by external environment.

In some embodiments, the shielding structure 106 includes a first surface 106a adjacent to the first surface 104a of the molding 104 and a second surface 106c adjacent to the second surface 104c of the molding 104. In some embodiments, the first surface 106a of the shielding structure 106 is adjacent to first surfaces (101a, 102a, 103a) of the devices (101, 102, 103), and the second surface 106c of the shielding structure 106 is adjacent to second surfaces (101c, 102c, 103c) of the devices (101, 102, 103).

In some embodiments, the semiconductor structure 100 includes several shielding structures 106. The shielding structures 106 define several compartments, and at least one of the devices (101, 102, 103) is disposed within one of the compartments. Each of the devices (101, 102, 103) is surrounded by one of the compartments.

In some embodiments, the second surface 106c of the shielding structure 106 includes a recessed portion 106b recessed towards the first surface 104a of the molding 104. In some embodiments, the recessed portion 106b of the second surface 106c of the shielding structure 106 is disposed adjacent to the second surface 104c of the molding 104. In some embodiments, the recessed portion 106b is configured for molding compound or epoxy material flowing through, so that the molding compound or epoxy material can fill a space between the shielding structure 106 and the devices (101, 102, 103) and become a molding 104. In some embodiments, the molding 104 is absent from the recessed portion 106b of the shielding structure 106. The recessed portion 106b would not be filled by the molding 104.

In some embodiments, the recessed portion 106b of the second surface 106c of the shielding structure 106 includes a height H extended towards the first surface 104a of the molding. In some embodiments, the height H is substantially greater than about 50 um. In some embodiments, the height H is about 30 um to about 100 um. In some embodiments, the recessed portion 106b of the second surface 106c of the shielding structure 106 includes a width W substantially parallel to the second surface 104c of the molding 104. In some embodiments, the width W is substantially greater than about 100 um. In some embodiments, the width W is about 50 um to about 300 um.

Figure 4B:
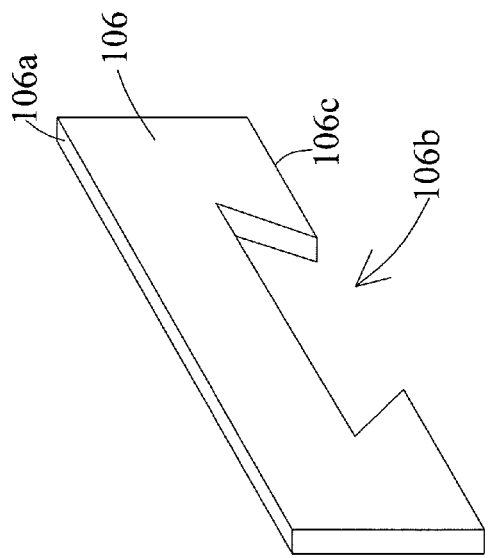
FIGS. 4A-4D are schematic views of a shielding structure with a recessed portion in various shapes in accordance with some embodiments of the present disclosure.
Figure 4D:
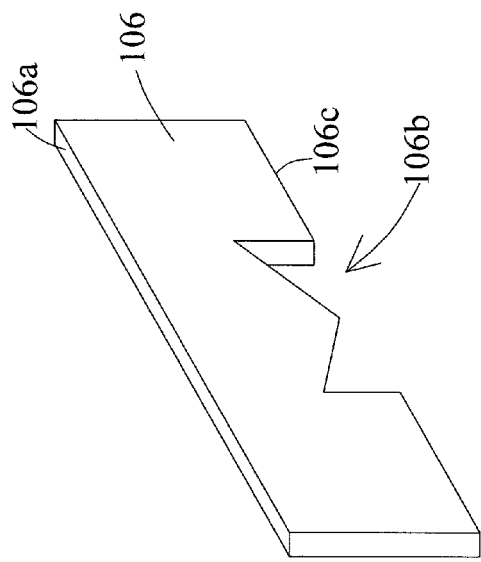
Figure 4A:
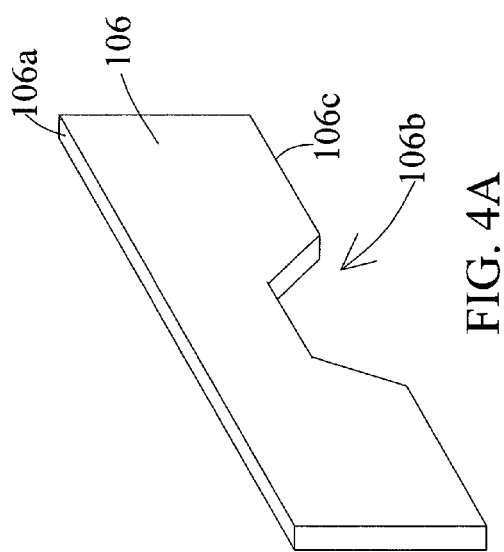
Figure 4C:
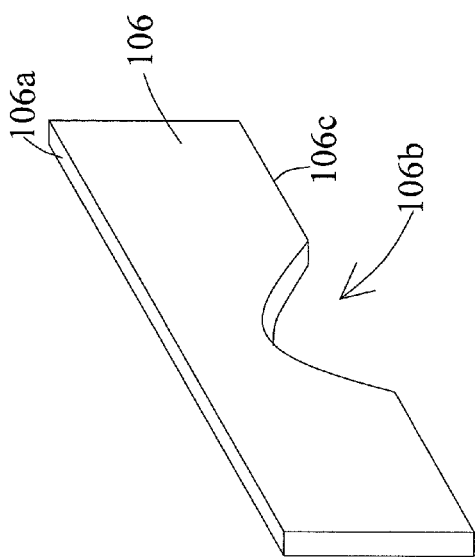

In some embodiments, the recessed portion 106*b* of the second surface 106*c* of the shielding structure 106 is in a rectangular or quadrilateral shape as shown in FIGS. 1-3. In some embodiments, the recessed portion 106*b* is in various shapes such as tapered shape as in FIG. 4A, inverted tapered shape as in FIG. 4B, dome shape as in FIG. 4C, polygonal shape as in FIG. 4D, or etc.

Figure 5:
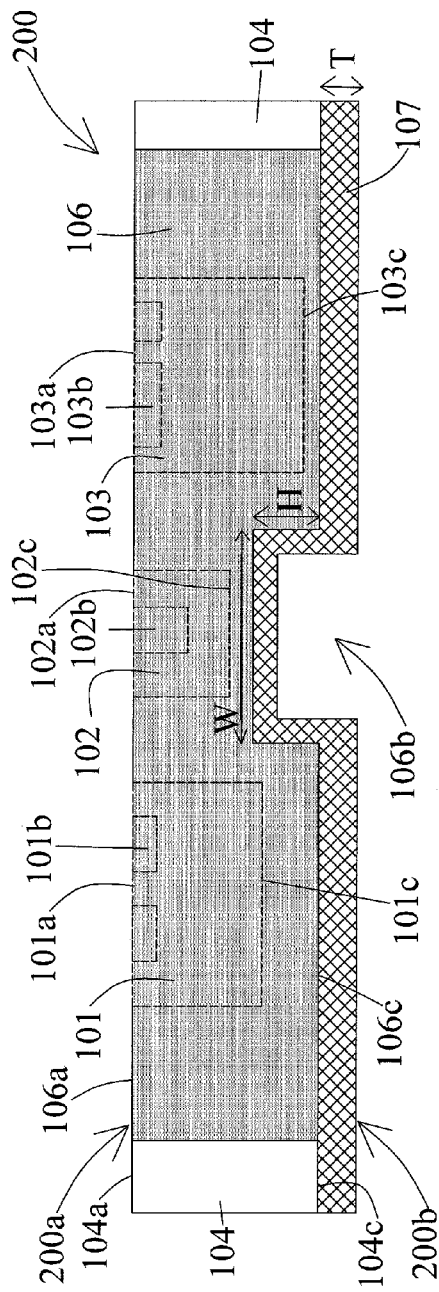
FIG. 5 is a side view of a semiconductor structure in accordance with some embodiments of the present disclosure.
Figure 6:
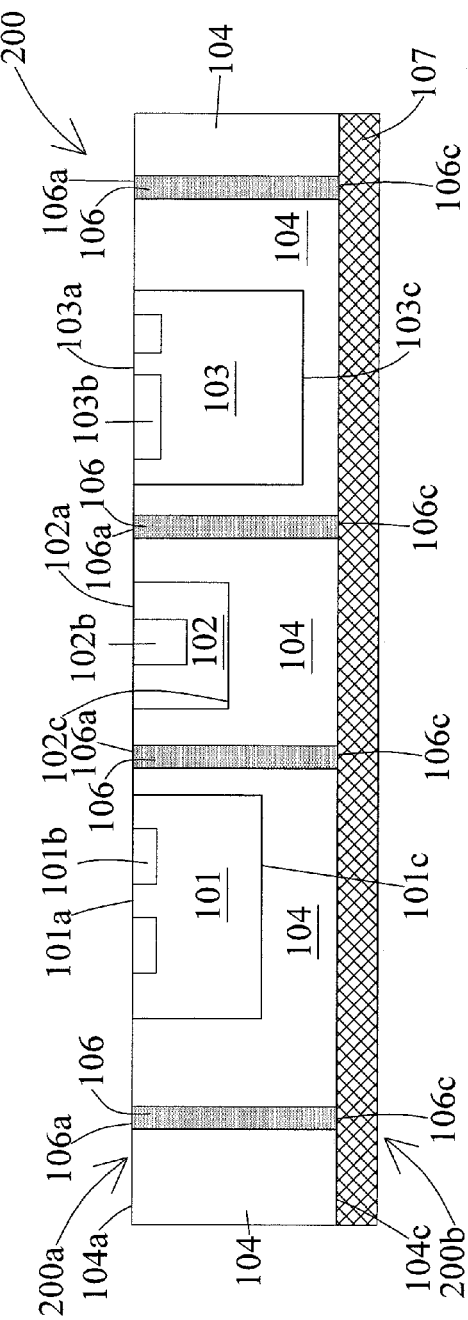
FIG. 6 is a front view of a semiconductor structure in accordance with some embodiments of the present disclosure.
Figure 7:
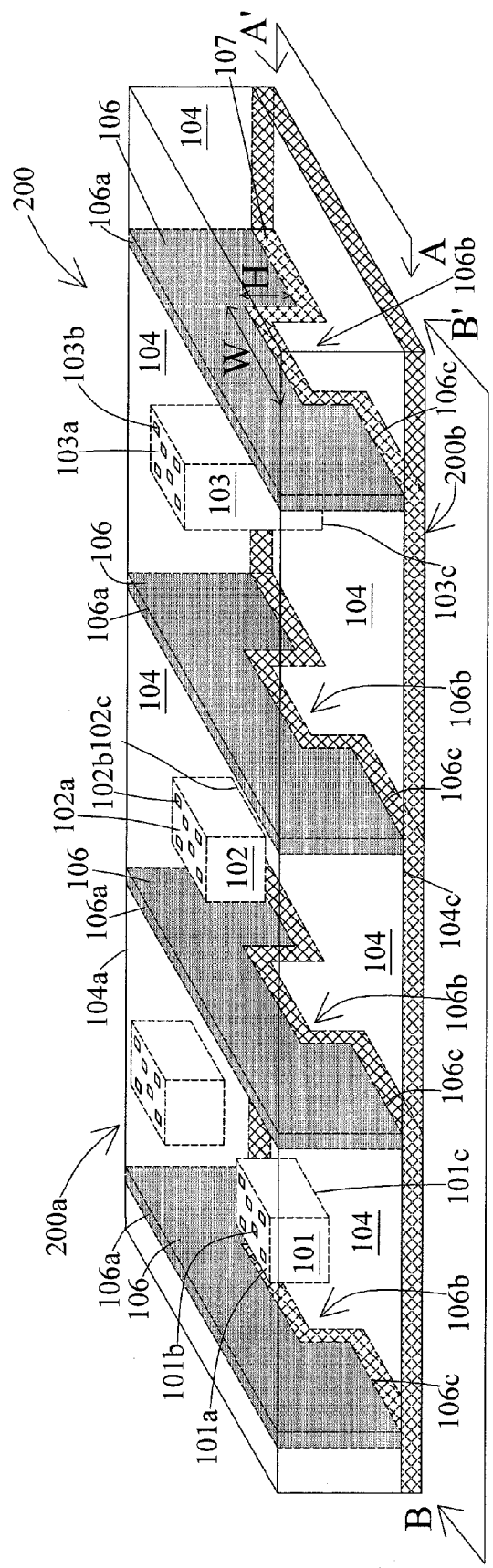
FIG. 7 is a perspective view of a semiconductor structure in accordance with some embodiments of the present disclosure.

FIGS. 5-7 are an embodiment of a semiconductor structure 200. FIG. 7 is a perspective view of the semiconductor structure 200. FIG. 5 is a side view of the semiconductor structure 200 from AA' of FIG. 7. FIG. 6 is a front view of the semiconductor structure 200 from BB' of FIG. 7.

The semiconductor structure 200 includes several devices (101, 102, 103), a molding 104 and a shielding structure 106 which have similar configurations as in any one of FIGS. 1-3. In some embodiments, the devices (101, 102, 103) are integrated or packaged to become the semiconductor structure 200. In some embodiments, the semiconductor structure 200 is a system in package (SiP). In some embodiments, the devices (101, 102, 103) include RF components and are integrated to become a radio frequency (RF) package.

In some embodiments, a metallic coating 107 is disposed on the second surface 104*c* of the molding 104 and the second surface 106*c* of the shielding structure 106. The metallic coating covers a back side 200*b* of the semiconductor structure 200. In some embodiments, the metallic coating 107 is disposed conformal to the recessed portion 106*b* of the second surface 106*c* of the shielding structure 106. In some embodiments, the metallic coating 107 is disposed conformal to the second surface 106*c* of the shielding structure 106, the second surface 104*c* of the molding 104 and the second surfaces (101*c*, 102*c*, 103*c*) adjacent to the second surface 104*c* of the molding 104.

In some embodiments, the metallic coating 107 is configured to prevent leakage of signal generated from the devices (101, 102, 103) and external electromagnetic interference to the devices (101, 102, 103). In some embodiments, the metallic coating 107 contacts with the shielding structure 106. In some embodiments, the metallic coating 107 includes solder, copper, lead or etc. In some embodiments, the metallic coating 107 and the shielding structure 106 include same or different material. In some embodiments, a thickness T of the metallic coating 107 is about 1 um to about 10 um.

Figure 8:
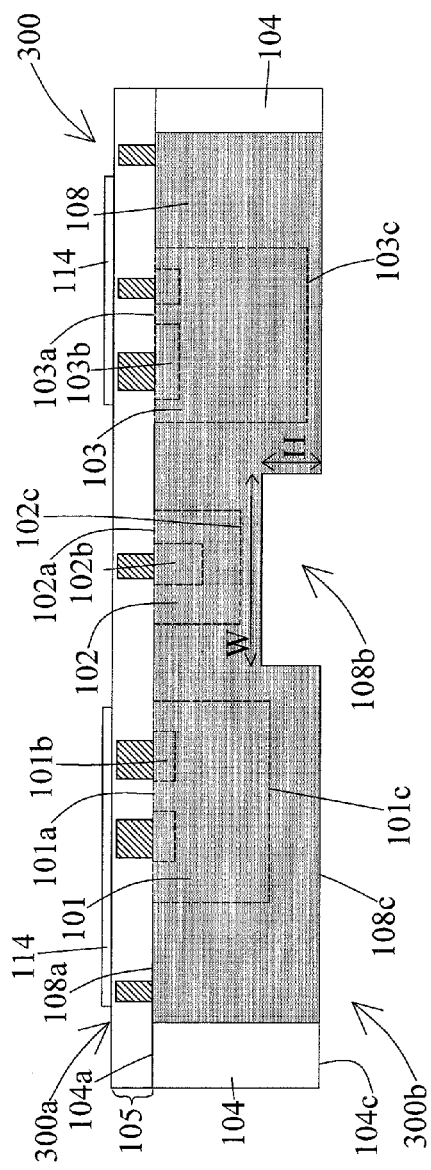
FIG. 8 is a side view of a semiconductor structure in accordance with some embodiments of the present disclosure.
Figure 9:
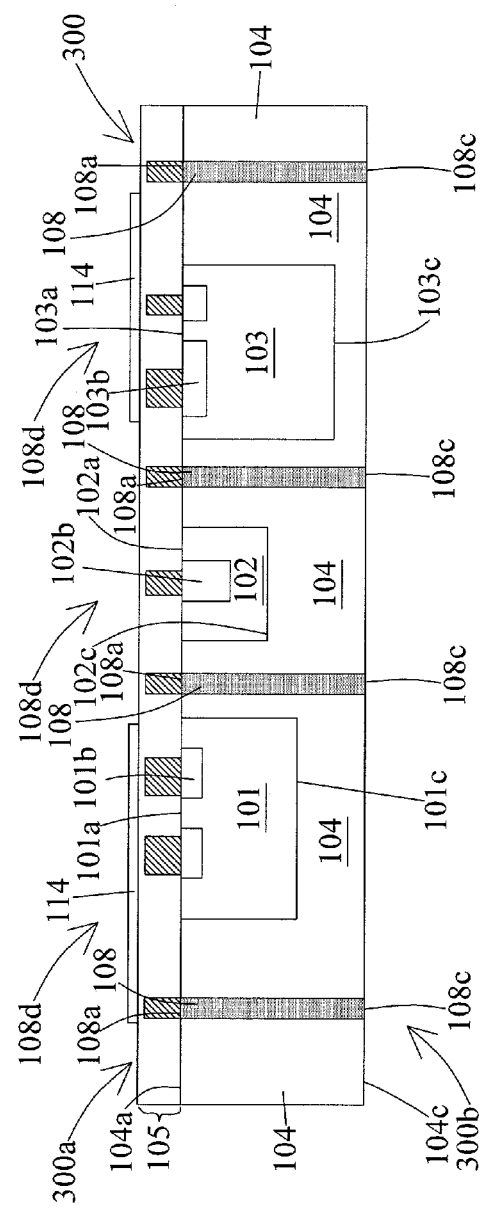
FIG. 9 is a front view of a semiconductor structure in accordance with some embodiments of the present disclosure.

FIGS. 8 and 9 are an embodiment of a semiconductor structure 300. FIG. 8 is a side view of the semiconductor structure 300. FIG. 9 is a front view of the semiconductor structure 300. The semiconductor structure 300 includes several devices (101, 102, 103), a molding 104 and a metallic coating 107 which have similar configurations as in any one of FIGS. 5-7. In some embodiments, the devices (101, 102, 103) are integrated or packaged to become the semiconductor structure 300. In some embodiments, the semiconductor structure 300 is a system in package (SiP).

In some embodiments, a redistribution layer (RDL) 105 is disposed over several active components (101*b*, 102*b*, 103*b*) of the devices (101, 102, 103) and the molding 104 adjacent to the active components (101*b*, 102*b*, 103*b*). In some embodiments, the RDL 105 interconnects the active components (101*b*, 102*b*, 103*b*) disposed on the first surfaces (101*a*, 102*a*, 103*a*) of the devices (101, 102, 103). In some embodiments, the RDL 105 integrates the circuitries of the devices (101, 102, 103).

In some embodiments, a redistribution layer (RDL) 105 is disposed over the first surface 104*a* of the molding 104 and first surfaces (101*a*, 102*a*, 103*a*) of the devices (101, 102, 103). The first surfaces (101*a*, 102*a*, 103*a*) are adjacent to the first surface 104*a* of the molding 104. In some embodiments, the RDL 105 is configured to electrically connect with the active component of at least one of the devices (101, 102, 103).

In some embodiments, the die pads 101*b* and the conductive structures (102*b*, 103*b*) are electrically connected to the RDL 105. In some embodiments, the RDL 105 is an electrical connection to and/or between the devices (101, 102, 103) and circuitry external to the devices (101, 102, 103). The RDL 105 re-routes a path of a circuit from the die pad 101*b* or conductive structures 102*b*, 103*b* to the circuitry external to the devices (101, 102, 103). In some embodiments, the RDL 105 is a post passivation interconnect (PPI) which is a conductive interconnect structure on a passivation layer disposed over the first surfaces (101*a*, 102*a*, 103*a*) of the devices (101, 102, 103). In some embodiments, a bond pad 114 is disposed over and electrically connected to the RDL 105. In some embodiments, the bond pad 114 is a land grid array (LGA) pad configured to be mounted on a print circuit board (PCB). In some embodiments, the bond pad 114 is a ball grid array (BGA) pad configured to receive a conductive bump.

In some embodiments, the RDL 105 includes material such as gold, silver, copper, nickel, tungsten, aluminum, and/or alloys thereof. In some embodiments, the RDL 105 includes a seed layer and a metal layer which are disposed in a sequence.

In some embodiments, the semiconductor structure 300 includes a shielding structure 108 defined with several compartments 108*d*. In some embodiments, the shielding structure 108 is in a frame configuration. In some embodiments, at least one of the devices (101, 102, 103) is disposed within one of the compartments 108*d*. The shielding structure 108 is configured to isolate the devices (101, 102, 103) in order to prevent leakage of signal from the devices (101, 102, 103) and prevent electromagnetic interference from the environment.

In some embodiments, the molding 104 is disposed around the devices (101, 102, 103) and the shielding structure 108. The shielding structure 108 is disposed within the molding 104 and between the devices (101, 102, 103). In some embodiments, the shielding structure 108 is extended between the first surface 104*a* and the second surface 104*c* of the molding 104. In some embodiments, the shielding structure 108 is extended vertical to the RDL 105. In some embodiments, the shielding structure 108 is electrically connected with the RDL 105.

In some embodiments, the shielding structure 108 includes several recessed portions 108*b*, and each of the recessed portions 108*b* is recessed towards the RDL 105. In some embodiments, the recessed portions 108*b* are configured for molding compound flowing through, so that the molding compound fills the compartments 108*d* and a molding 104 could be formed. In some embodiments, at least one of the recessed portions 108*b* of the shielding structure 108 is absent from the molding 104. The molding 104 is not present within at least one of the recessed portions 108*b*.

Figure 10:
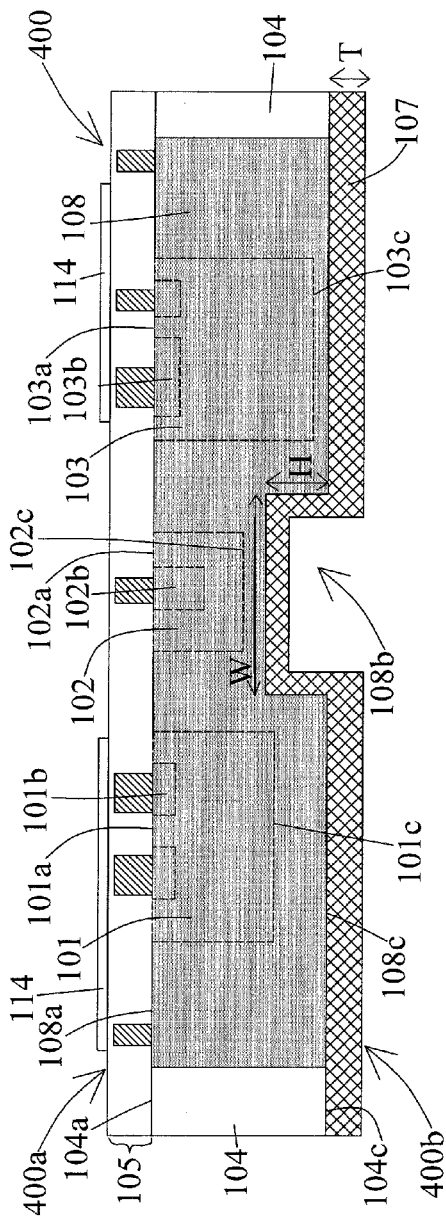
FIG. 10 is a side view of a semiconductor structure in accordance with some embodiments of the present disclosure.
Figure 11:
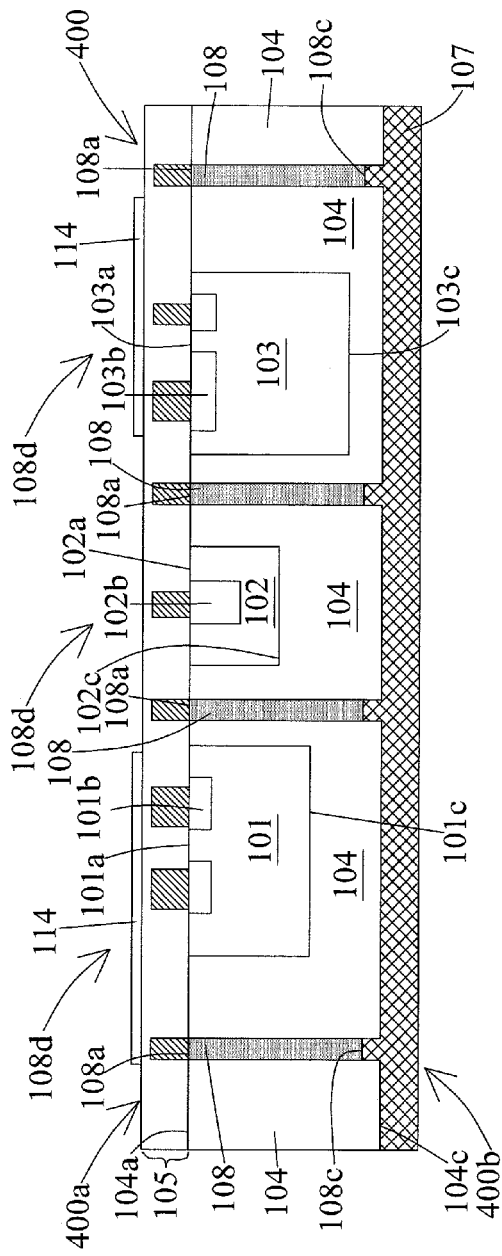
FIG. 11 is a front view of a semiconductor structure in accordance with some embodiments of the present disclosure.

FIGS. 10 and 11 are an embodiment of a semiconductor structure 400. FIG. 10 is a side view of the semiconductor structure 400. FIG. 11 is a front view of the semiconductor structure 400. The semiconductor structure 400 includes several devices (101, 102, 103), a molding 104, RDL 105 and a shielding structure 108 which have similar configurations as in FIG. 8 or 9. In some embodiments, the devices (101, 102, 103) are integrated or packaged to become the semiconductor structure 300. In some embodiments, the semiconductor structure 300 is a system in package (SiP).

In some embodiments, the semiconductor structure 400 includes a metallic coating 107 which has similar configuration as in FIG. 5 or 6. In some embodiments, the metallic coating 107 is disposed on a back side 400b of the semiconductor structure 400. In some embodiments, the metallic coating is disposed on the second surface 104c of the molding 104.

In some embodiments, the second surface 108c of the shielding structure 108 is recessed from the second surface 104c of the molding 104, and some portions of the metallic coating 107 are disposed within the molding 104 and interfaced with the second surface 108c of the shielding structure 108. In some embodiments, the shielding structure 108 is electrically connected with the metallic coating 107. In some embodiments, the metallic coating 107 is electrically connected with the shielding structure 108 and the RDL 105. In some embodiments, the shielding structure 108 includes different material from the metallic coating 107.

In the present disclosure, a method of manufacturing a semiconductor structure is also disclosed. In some embodiments, a semiconductor structure is formed by a method 500. The method 500 includes a number of operations and the description and illustration are not deemed as a limitation as the sequence of the operations.

Figure 12:
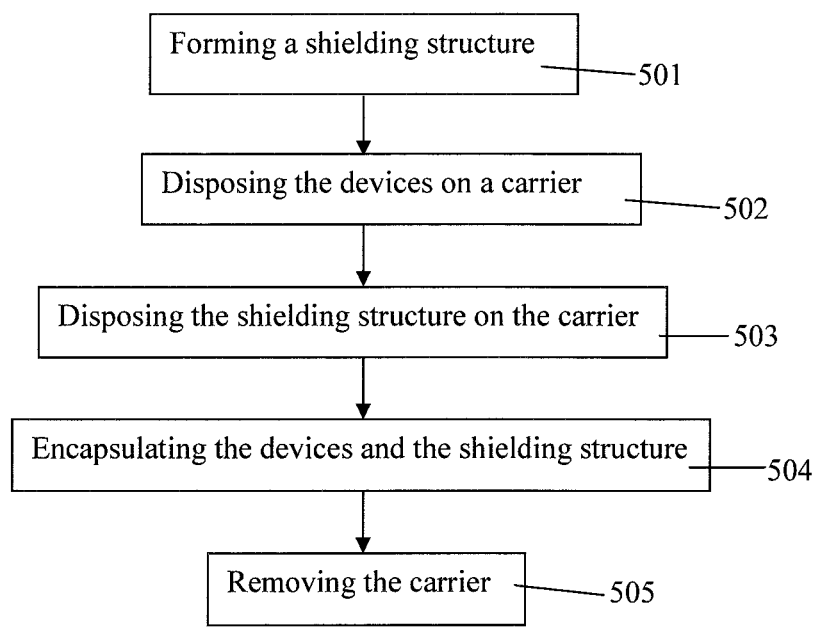
FIG. 12 is a flow diagram of a method of manufacturing a semiconductor structure in accordance with some embodiments of the present disclosure.

FIG. 12 is an embodiment of a method 500 of manufacturing a semiconductor structure. The method 500 includes a number of operations (501, 502, 503, 504 and 505).

In operation 501, a shielding structure 106 is formed as shown in FIG. 12A. In some embodiments, the shielding structure 106 includes a first surface 106a and a second surface 106c. In some embodiments, the shielding structure 106 includes a recessed portion 106b recessed towards the first surface 106a. In some embodiments, the recessed portion 106b is formed on the second surface 106c of the shielding structure 106. In some embodiments, the recessed portion 106b is configured for molding compound or epoxy flowing through. In some embodiments, the recessed portion 106b is formed in any suitable shape such as rectangular, quadrilateral, polygonal, etc. In some embodiments, several shielding structures 106 define several compartments, and each of the compartments is configured to surround at least one of a device and isolate several devices. In some embodiments, the shielding structure 106 has similar configuration as in any one of FIGS. 1-11.

In operation 502, several devices (101, 102, 103) are disposed on a carrier 111 shown in FIG. 12B. In some embodiments, the carrier 111 includes glass or silicon. In some embodiments, the devices (101, 102, 103) are temporarily attached to the carrier 111. In some embodiments, second surfaces (101c, 102c, 103c) of the devices (101, 102, 103) are attached to the carrier 111 by a coating 111a such as a light-to-heat conversion (LTHC) material, a die attach film (DAF), or etc. In some embodiments, first surfaces (101a, 102a, 103a) of the devices (101, 102, 103) are opposite to the second surfaces (101c, 102c, 103c) of the devices (101, 102, 103) respectively.

In some embodiments, the devices (101, 102, 103) include a packaged device and a unpackaged device. In some embodiments, the device 101 is a die or a bare chip. In some embodiments, the device 102 is a surface mount device (SMD). In some embodiments, the device 103 is a ball grid array (BGA) package, quad flat no lead (QFN) package, land grid array (LGA) package or other kinds of packages. In some embodiments, the devices (101, 102, 103) have similar configuration as in any one of FIGS. 1-11.

In some embodiments, each of the first surfaces (101a, 102a, 103a) of the devices (101, 102, 103) includes several active components (101b, 102b, 103b) thereon. In some embodiments, the first surface 101a of the device 101 includes a die pad 101b. The die pad 101b is configured to connect a circuitry within the device 101 with an external circuitry.

In operation 503, the shielding structure 106 formed in the operation 501 is disposed on the carrier 111 as shown in FIGS. 12C and 12D. FIG. 12C is a side view and FIG. 12D is a front view. In some embodiments, the shielding structure 106 is disposed between the devices (101, 102, 103). In some embodiments, the second surface 106c of the shielding structure 106 is disposed on the carrier 111.

In some embodiments, the shielding structure 106 is configured to isolate the devices (101, 102, 103) from each other, prevent external electromagnetic interference to the devices (101, 102, 103) and prevent leakage of signals generated from the devices (101, 102, 103). In some embodiments, the shielding structure 106 is disposed upright to the carrier 111. In some embodiments, the shielding structure 106 has similar configuration as in any one of FIGS. 1-11.

Figure 12E:
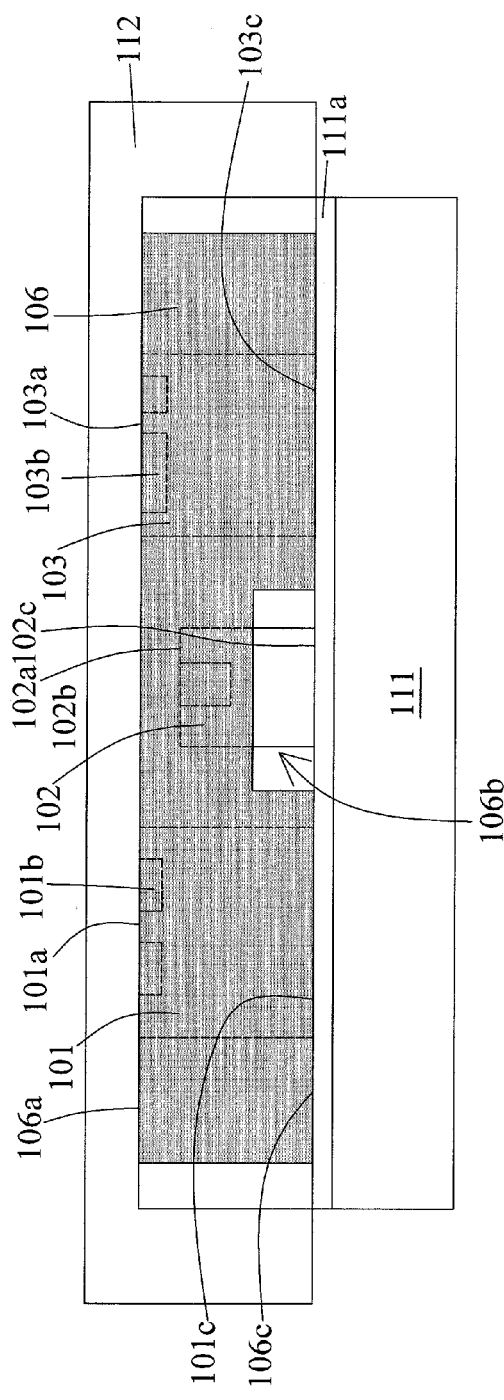
FIGS. 12E and 12F are schematic views of formation of a molding in accordance with some embodiments of the present disclosure.
Figure 12F:
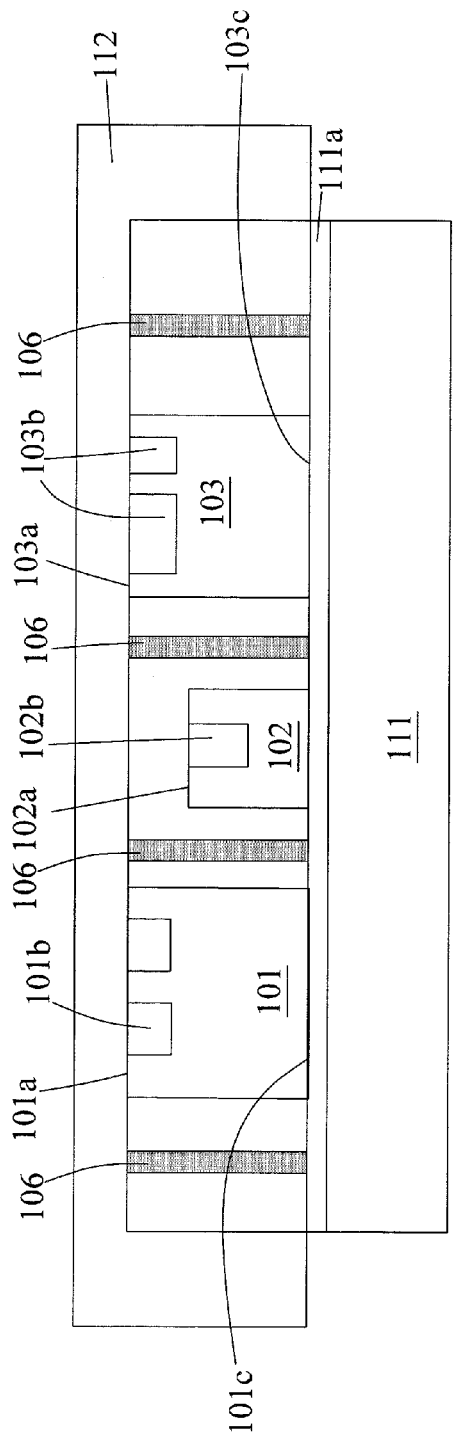

In operation 504, the devices (101, 102, 103) and the shielding structure 106 are encapsulated by a molding 104 as shown in FIGS. 12E and 12F. FIG. 12E is a side view and FIG. 12F is a front view. In some embodiments, the devices (101, 102, 103) and the shielding structure 106 are enclosed by a mold case 112, and then a molding compound or epoxy material is injected into the mold case 112. The molding compound would fill a space between the devices (101, 102, 103), the shielding structure 106 and the mold case 112. In some embodiments, the devices (101, 102, 103) and the shielding structure 106 are encapsulated by transfer molding operations or compression molding operations. As a result, the molding 104 surrounding the devices (101, 102, 103) and the shielding structure 106 is formed.

When the molding 104 is formed, the mold case 112 is removed as shown in FIGS. 12G and 12H. FIG. 12G is a side view and FIG. 12H is a front view. In some embodiments, the molding 104 includes a first surface 104a and the second surface 104c. The first surface 104a is adjacent to the active component (101b, 102b, 103b) of at least one of the devices (101, 102, 103). The second surface 104c is opposite to the first surface 104a. In some embodiments, the active components are die pad 101b, conductive structure (102b or 103b), etc. In some embodiments, the first surface 106a of the shielding structure 106 is adjacent to the first surface 104a of the molding 104, and the second surface 106c of the shielding structure 106 is adjacent to the second surface 104c of the molding. In some embodiments, the recessed portion 106b of the shielding structure 106 is recessed towards the first surface 104a of the molding 104.

Figure 12I:
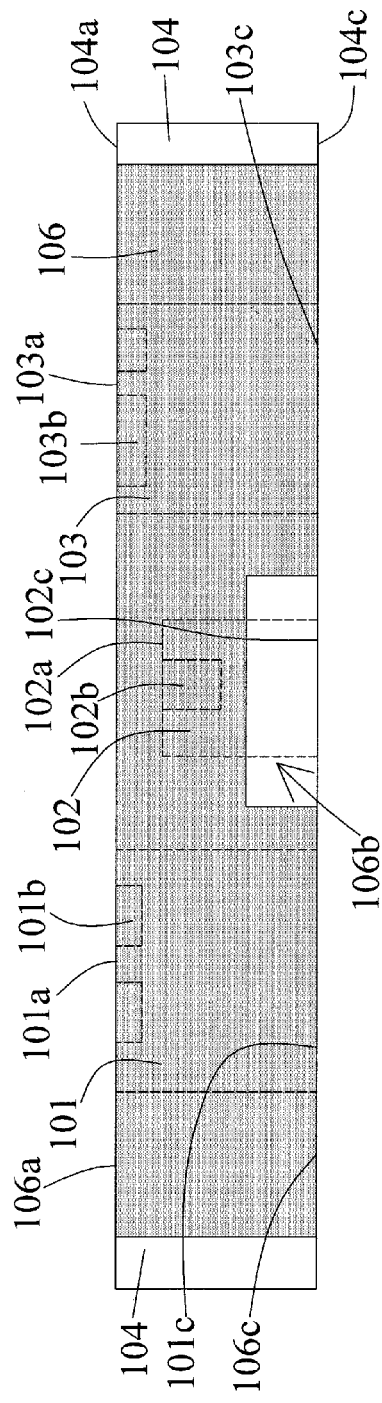
FIGS. 12I and 12J are schematic views of removal of a carrier in accordance with some embodiments of the present disclosure.
Figure 12J:
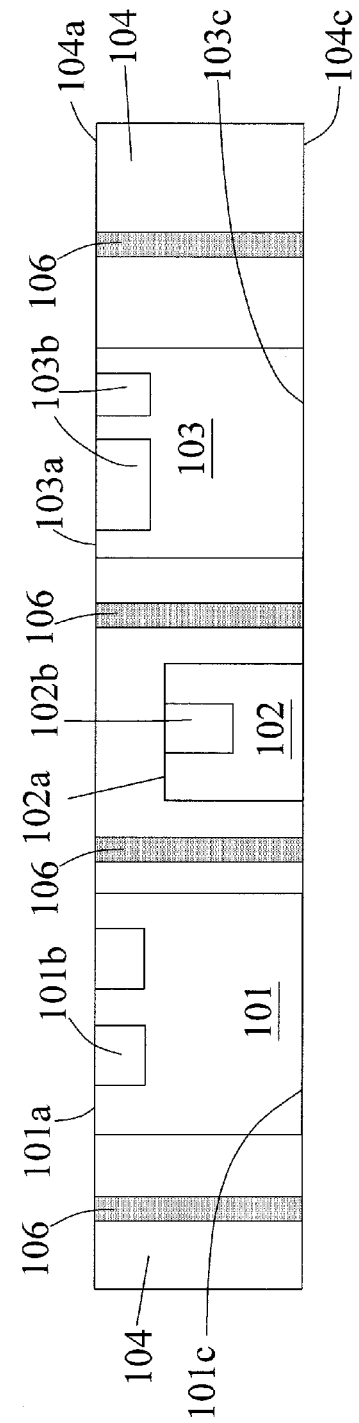

In operation 505, the carrier 111 (referring to FIGS. 12G and 12H) is removed from the devices (101, 102, 103), the shielding structure 106 and the molding 104 as shown in FIGS. 12I and 12J. FIG. 12I is a side view and FIG. 12J is a front view. The carrier 111 is detached and removed from second surfaces (101c, 102c, 103c) of the devices (101, 102, 103), second surface 106c of the shielding structure 106 and the second surface 104c of the molding 104. The molding 104 surrounds and supports the devices (101, 102, 103) and the shielding structure 106.

When the carrier 111 is removed, the first surfaces (101a, 102a, 103a) of the devices (101, 102, 103) and the second surface 106c of the shielding structure 106 are exposed from the molding 104. In some embodiments, the molding 104 disposed within the recessed portion 106b of the shielding structure 106 is removed. In some embodiments, the semiconductor structure illustrated in FIGS. 12I and 12J has similar configuration as the semiconductor structure 100 in FIGS. 1 and 2.

In some embodiments, a semiconductor structure is formed by a method 600. The method 600 includes a number of operations and the description and illustration are not deemed as a limitation as the sequence of the operations.

Figure 13:
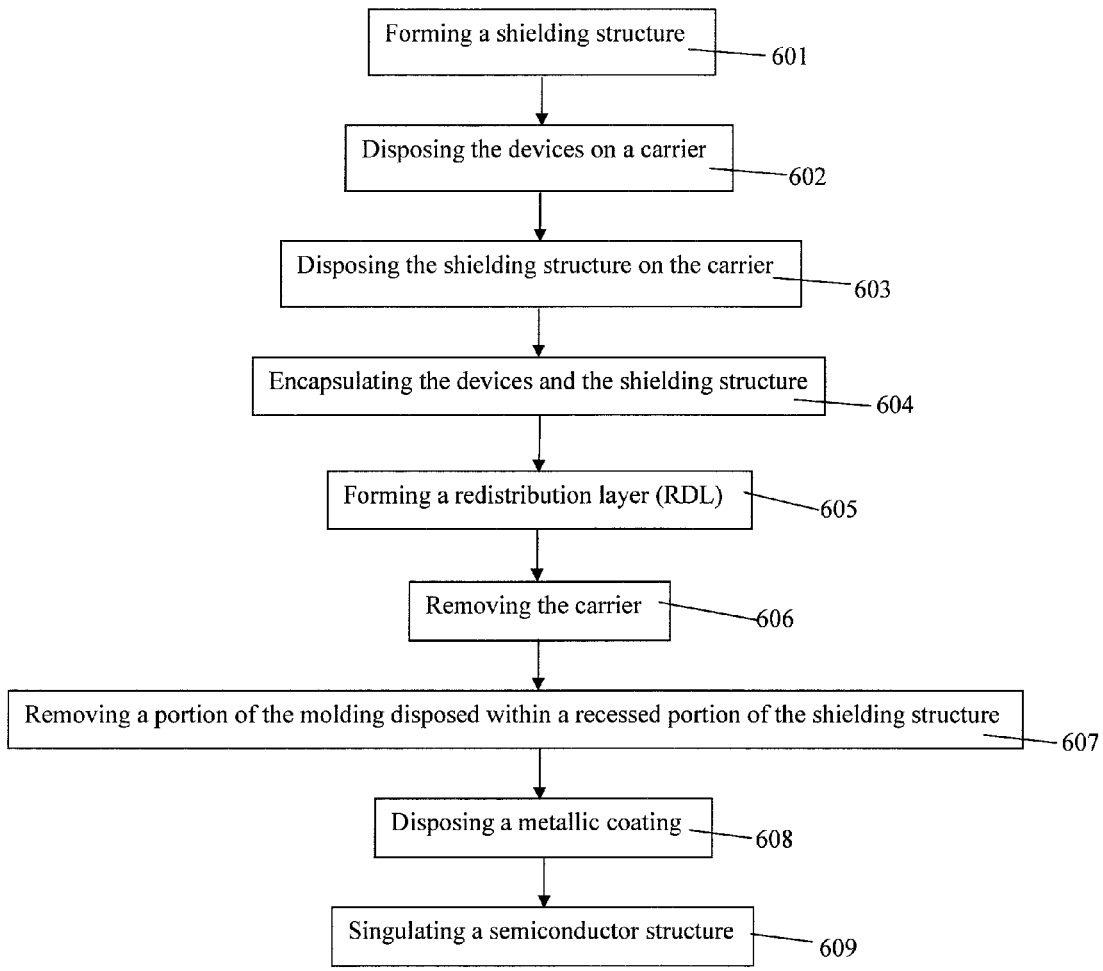
FIG. 13 is a flow diagram of a method of manufacturing a semiconductor structure in accordance with some embodiments of the present disclosure.

FIG. 13 is an embodiment of a method 600 of manufacturing a semiconductor structure. The method 600 includes a number of operations (601, 602, 603, 604, 605, 606, 607, 608 and 609).

Figure 13C:
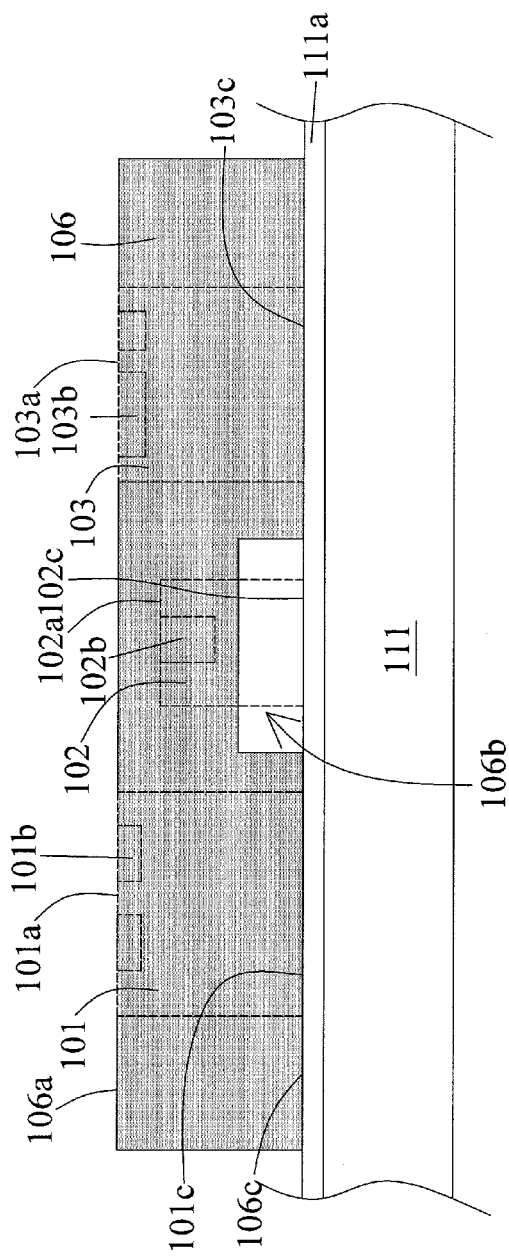
FIGS. 13C and 13D are schematic views of a shielding structure disposed on a carrier in accordance with some embodiments of the present disclosure.
Figure 13D:
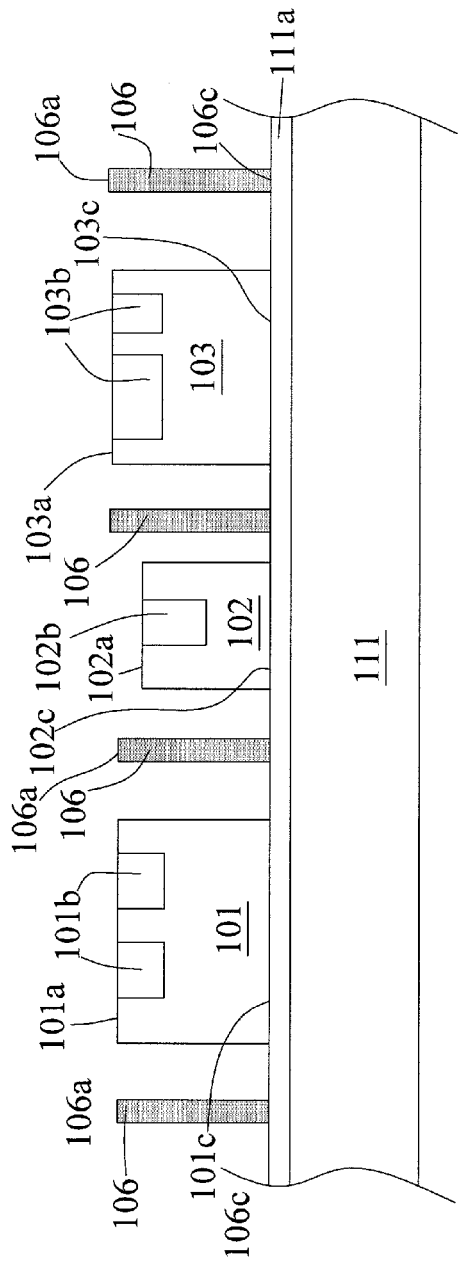

In operation 601, a shielding structure 106 is formed as shown in FIG. 13A. In some embodiments, the operation 601 is similar to the operation 501. In operation 602, several devices (101, 102, 103) are disposed on a carrier 111 as shown in FIG. 13B. In some embodiments, the operation 602 is similar to the operation 502. In operation 603, the shielding structure 106 is disposed on the carrier 111 as shown in FIGS. 13C and 13D. In some embodiments, the operation 603 is similar to the operation 503.

Figure 13E:
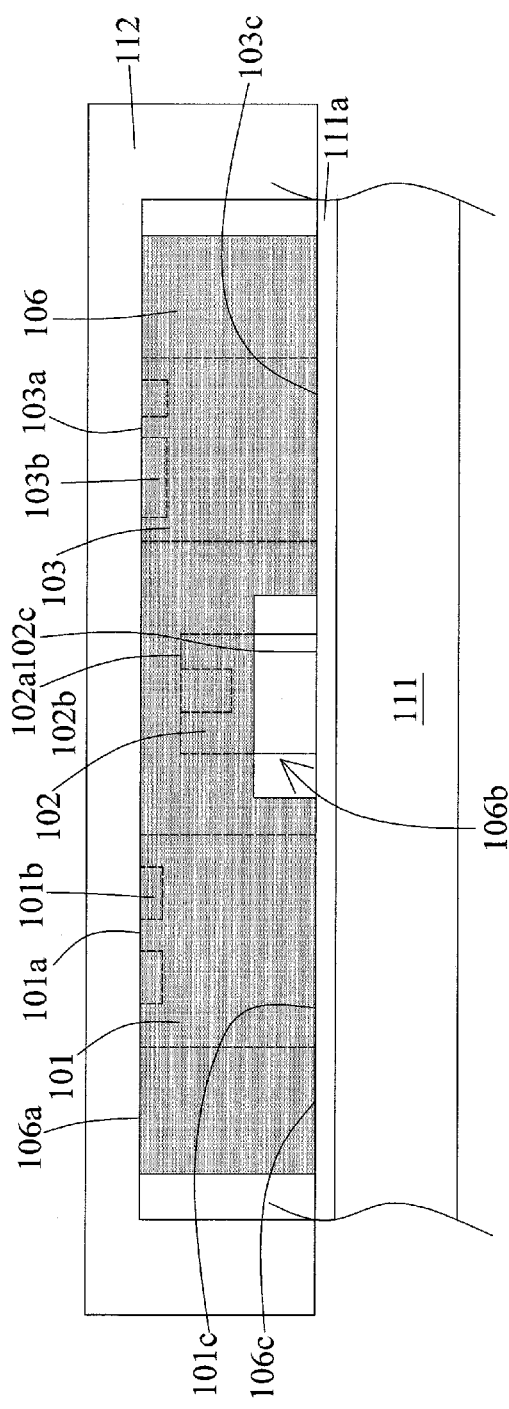
FIGS. 13E and 13F are schematic views of formation of a molding in accordance with some embodiments of the present disclosure.
Figure 13F:
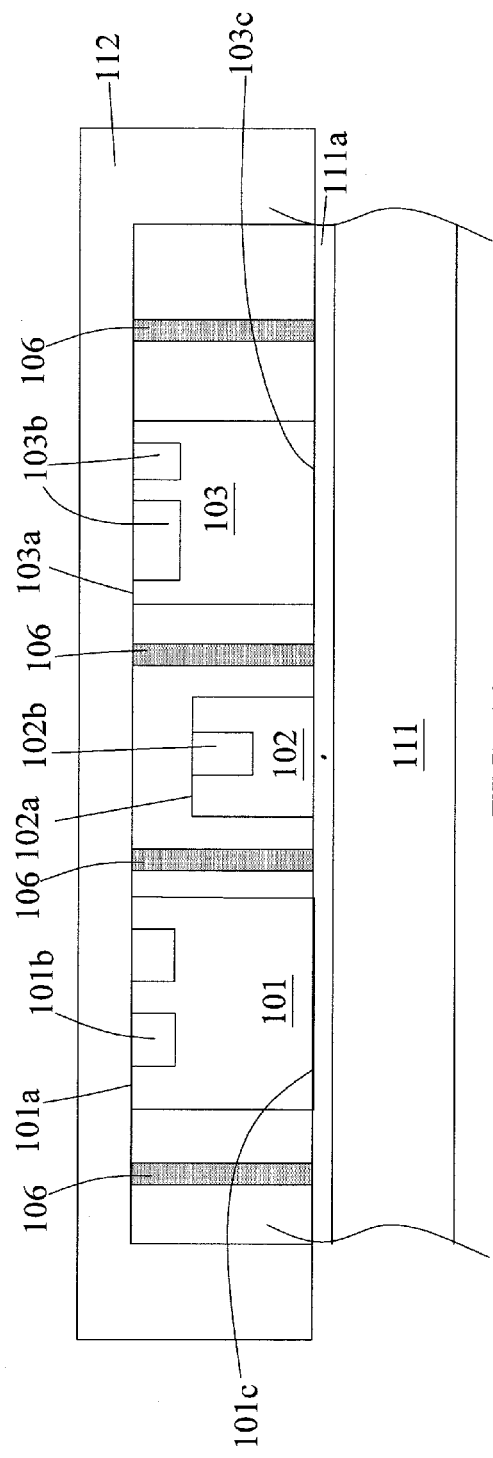

In operation 604, the devices (101, 102, 103) and the shielding structure 106 are encapsulated by a molding 104 as shown in FIGS. 13E-13H. In some embodiments, the molding 104 is formed by a transfer molding operations or compression molding operations as shown in FIGS. 13E and 13F. In some embodiments, the operation 604 is similar to the operation 504.

In operation 605, a redistribution layer (RDL) 105 is formed as shown in FIGS. 13I and 13J. In some embodiments, the RDL 105 over the first surface 104a of the molding 104 and the first surfaces (101a, 102a, 103a) of the devices (101, 102, 103) adjacent to the first surface 104a of the molding 104. In some embodiments, the RDL 105 is an electrical connection to and/or between the devices (101, 102, 103) and circuitry external to the devices (101, 102, 103). The RDL 105 re-routes a path of a circuit from the die pad 101b or conductive structures (102b, 103b) to the circuitry external to the devices (101, 102, 103). In some embodiments, the RDL 105 electrically connects with the shielding structure 106. Portions of the shielding structure 106 exposed from the first surface 104a of the molding 104 are contacted with the RDL 105. In some embodiments, a bond pad 114 is disposed over and electrically connected to the RDL 105. In some embodiments, the bond pad 114 is a land grid array (LGA) pad configured to be mounted on a print circuit board (PCB). In some embodiments, the bond pad 114 is a ball grid array (BGA) pad configured to receive a conductive bump.

Figure 13K:
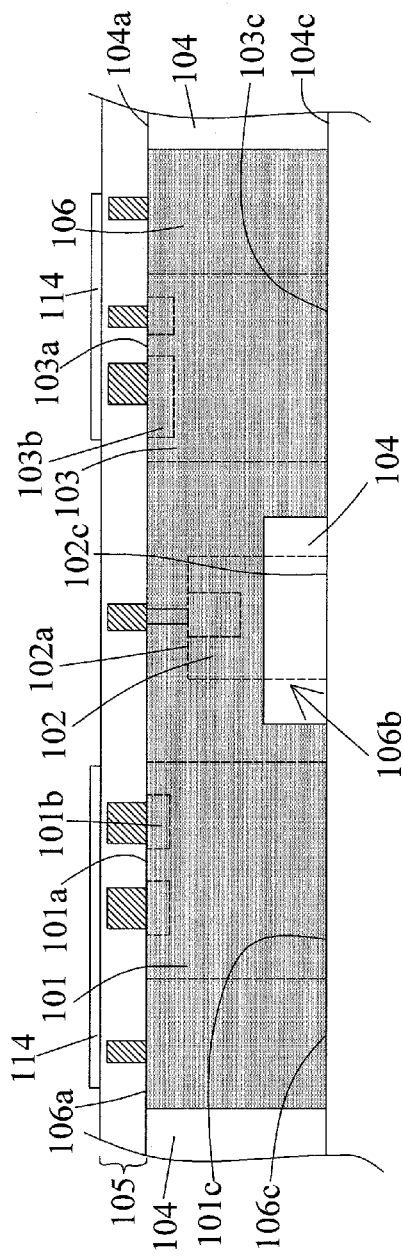
FIGS. 13K and 13L are schematic views of removal of a carrier in accordance with some embodiments of the present disclosure.
Figure 13L:
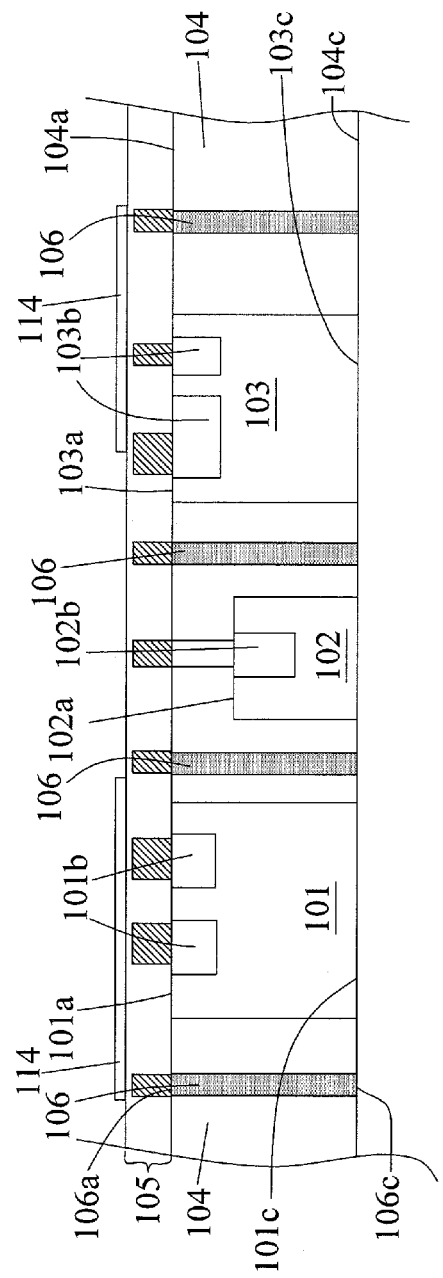

In operation 606, the carrier 111 is removed as shown in FIGS. 13K and 13L. In some embodiments, the operation 606 is similar to the operation 505.

Figure 13M:
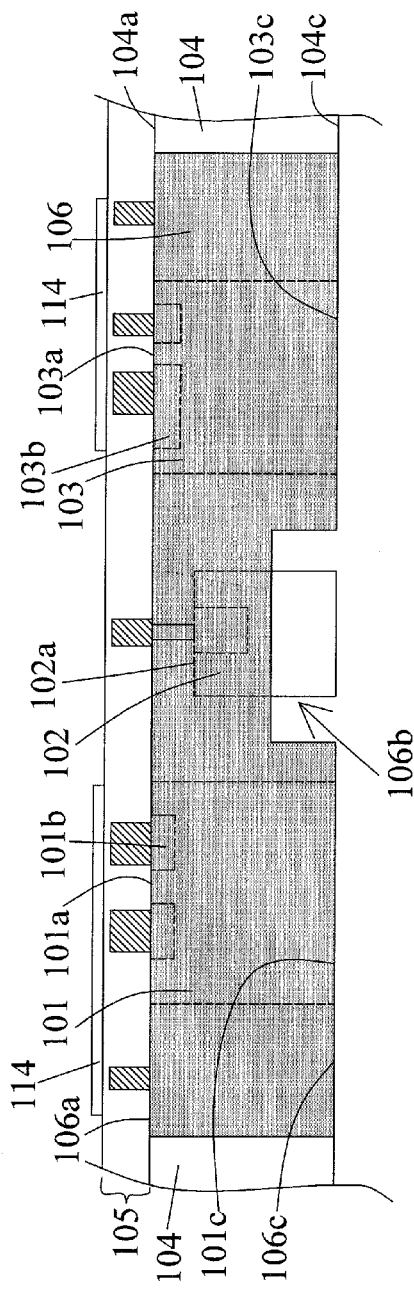
FIGS. 13M and 13N are schematic views of removal of a portion of a molding disposed within a recessed portion of a shielding structure in accordance with some embodiments of the present disclosure.
Figure 13N:
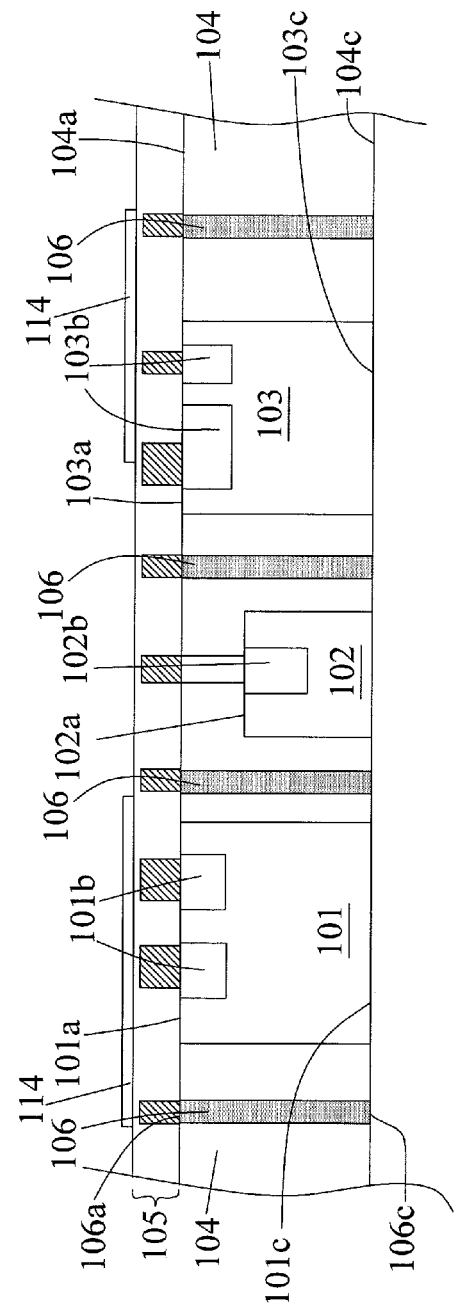

In operation 607, a portion of the molding 104 disposed within the recessed portion 106b of the shielding structure 106 is removed as shown in FIGS. 13M and 13N. In some embodiments, the portion of the molding 104 disposed within the recessed portion 106b is removed by any suitable method such as laser drilling operations. Therefore, the recessed portion 106 of the shielding structure 106 is exposed from the molding 104. In some embodiments, the semiconductor structure illustrated in FIGS. 13M and 13N has similar configuration as the semiconductor structure 100 in FIGS. 1 and 2.

Figure 13O:
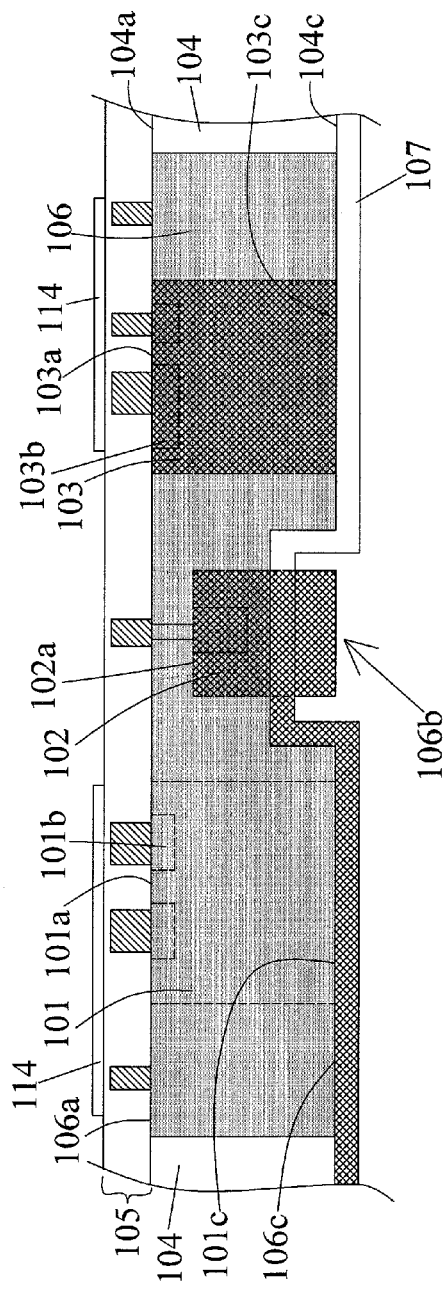
FIGS. 13O-13Q are schematic views of a metallic coating in accordance with some embodiments of the present disclosure.
Figure 13P:
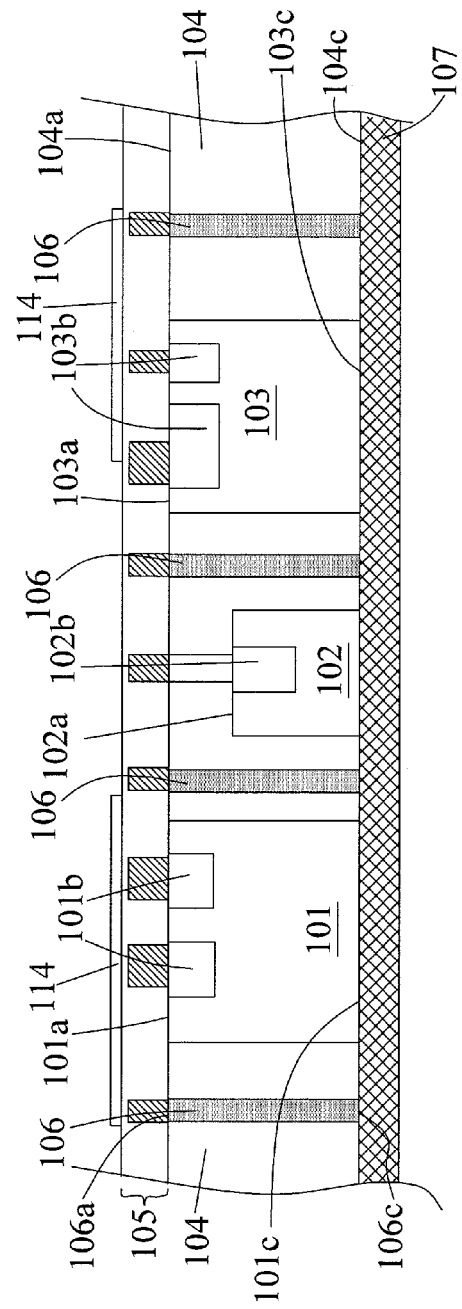
Figure 13Q:
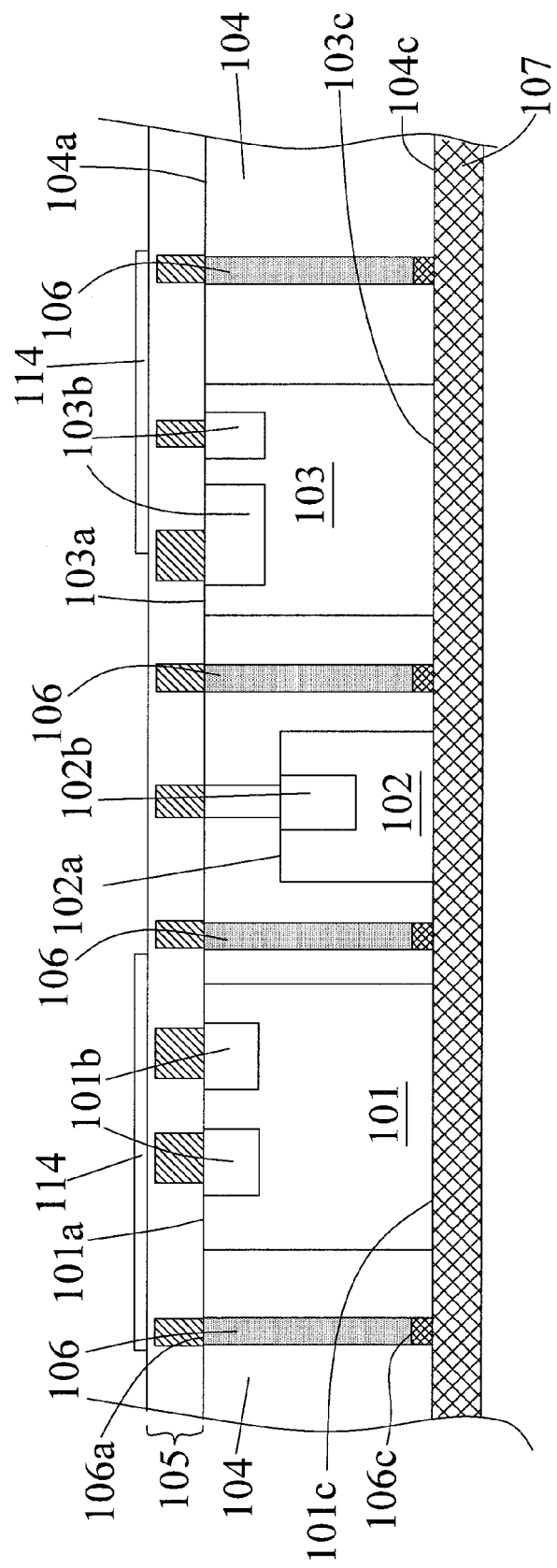

In operation 608, a metallic coating 107 is disposed conformal to the recessed portion 106b of the second surface 107c of the shielding structure 106 as shown in FIGS. 13O-13Q. In some embodiments, the metallic coating 107 is disposed conformal to the second surface 106c of the shielding structure 106, the second surface 104c of the molding 104 and the second surfaces (101c, 102c, 103c) of the devices (101, 102, 103) adjacent to the second surface 104c of the molding 104. In some embodiments, the metallic coating 107 is electrically connected to the RDL 105 and the shielding structure 106. In some embodiments, the semiconductor structure illustrated in FIGS. 13O and 13P has similar configuration as the semiconductor structure 200 in FIGS. 5-7.

In some embodiments as shown in FIG. 13Q, the second surface 106c of the shielding structure 106 is recessed from the second surface 104c of the molding 104, and some portions of the metallic coating 107 are disposed within the molding 104 and interfaced with the second surface 106c of the shielding structure 106. In some embodiments, the shielding structure 106 is electrically connected with the metallic coating 107. In some embodiments, the shielding structure 106 includes same or different material from the metallic coating 107. In some embodiments, the semiconductor structure illustrated in FIG. 13Q has similar configuration as the semiconductor structure 400 in FIGS. 10 and 11.

Figure 13R:
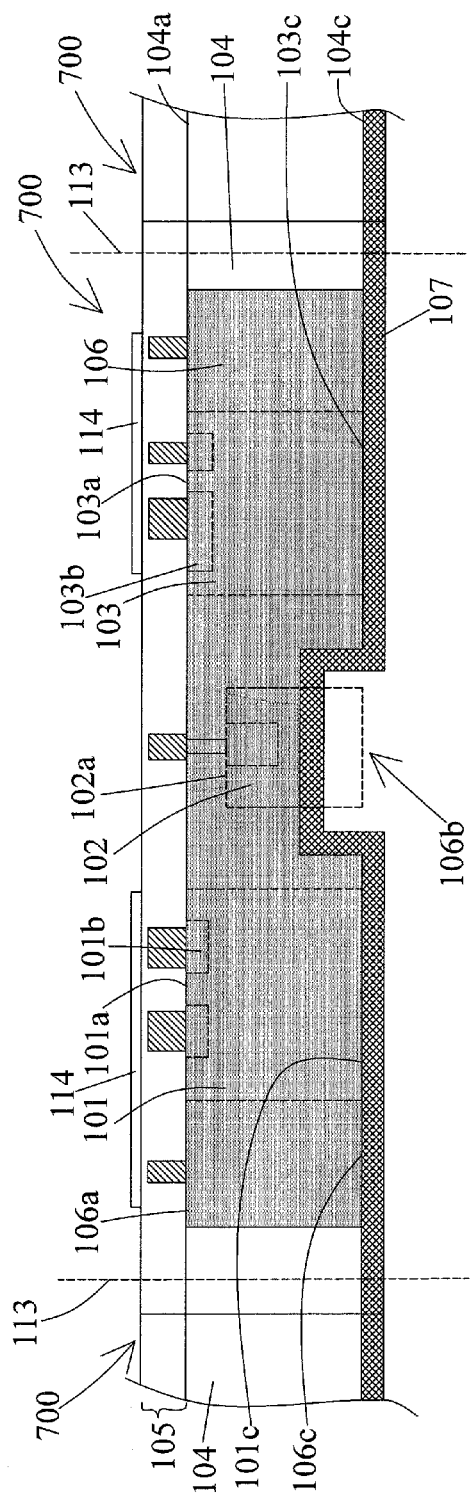
FIGS. 13R and 13S are schematic views of singulation of several semiconductor structures in accordance with some embodiments of the present disclosure.
Figure 13S:
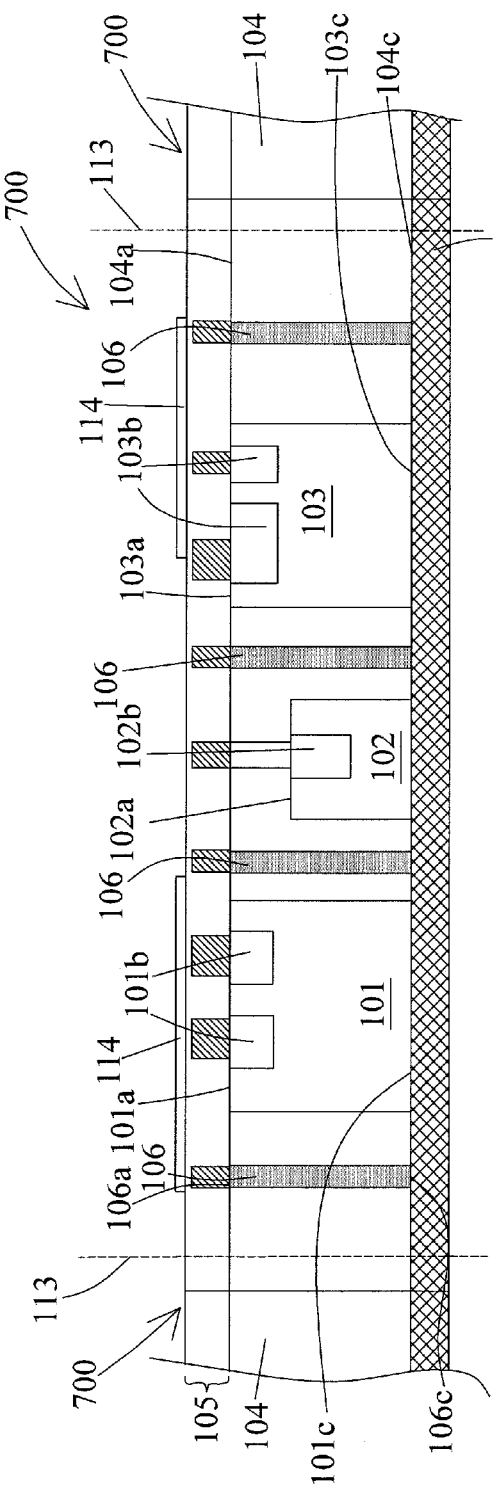
Figure 13T:
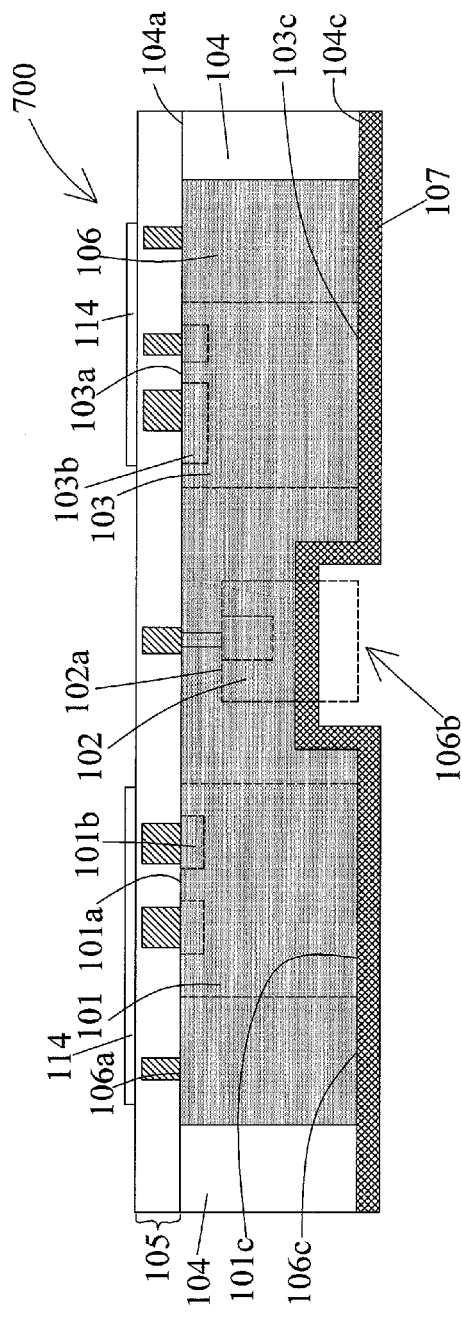
FIGS. 13T and 13U are schematic views of a singulated semiconductor structure in accordance with some embodiments of the present disclosure.
Figure 13U:
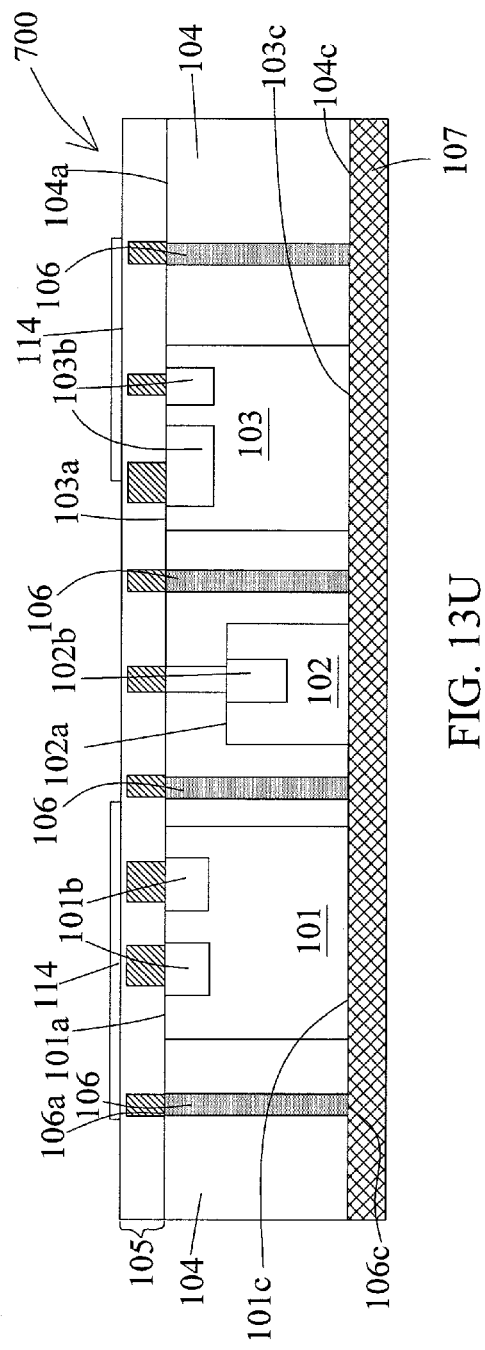

In operation 609, a semiconductor structure 700 is singulated as shown in FIGS. 13R and 13S. In some embodiments, several pieces of the semiconductor structures 700 are formed simultaneously by operations 601-608. The semiconductor structures 700 are horizontally arranged and neighbored with each other. The molding 104 connects the semiconductor structures 700 with each other. The semiconductor structures 700 are separated along several scribe line regions 113. In some embodiments, the semiconductor structures 700 are singulated by a mechanical or laser blade. Several pieces of the semiconductor structure 700 as shown in FIGS. 13T and 13U are singulated by sawing along the scribe line regions 113. Therefore, several pieces of the semiconductor structure 700 are produced. In some embodiments, the semiconductor structures 700 structurally same as each other. In some embodiments, the semiconductor structure 700 has similar configuration as the semiconductor structure 400 in FIGS. 10 and 11.

In the present disclosure, an improved semiconductor structure is disclosed. The semiconductor structure includes several devices, a shielding structure and a molding. The shielding structure includes a recessed portion configured for a molding compound flowing through during transfer molding or compression molding operations. Therefore, the molding compound could be flown through the recessed portion of the shielding structure and completely fill a space between the devices and the shielding structure. As a result, the devices and the shielding structure are completely encapsulated by the molding.

In some embodiments, a semiconductor structure includes a plurality of devices; a molding surrounding the plurality of devices and including a first surface adjacent to an active component of at least one of the plurality of devices and a second surface opposite to the first surface; and a shielding structure disposed within the molding and between two or more of the plurality of devices, wherein the shielding structure includes a first surface adjacent to the first surface of the molding and a second surface adjacent to the second surface of the molding, and the second surface of the shielding structure includes a recessed portion recessed towards the first surface of the molding.

In some embodiments, the recessed portion of the second surface of the shielding structure is disposed adjacent to the second surface of the molding. In some embodiments, the recessed portion of the second surface of the shielding structure includes a height extended towards the first surface of the molding, and the height is substantially greater than about 50 um. In some embodiments, the recessed portion of the second surface of the shielding structure includes a width substantially parallel to the second surface of the molding, and the width is substantially greater than about 100 um.

In some embodiments, the semiconductor structure further includes a metallic coating disposed conformal to the recessed portion of the second surface of the shielding structure. In some embodiments, the semiconductor structure further includes a metallic coating disposed conformal to the second surface of the shielding structure, the second surface of the molding and surfaces of the plurality of devices adjacent to the second surface of the molding. In some embodiments, the semiconductor structure further includes a metallic coating disposed conformal to the second surface of the shielding structure, the second surface of the molding and surfaces of the plurality of devices adjacent to the second surface of the molding, wherein the metallic coating includes solder.

In some embodiments, one of the plurality of devices has a substantially different height from another one of the plurality of devices. In some embodiments, the plurality of devices includes at least one unpackaged device and at least one packaged device, or the plurality of devices includes a bare chip, a die, a ball grid array (BGA) package, a quad flat no leads (QFN) package, a land grid array (LGA) package, a surface mount device (SMD) or a microelectromechanical systems (MEMS) device. In some embodiments, the semiconductor structure further includes a redistribution layer (RDL) disposed over the first surface of the molding and surfaces of the plurality of devices adjacent to the first surface of the molding, and the RDL is configured to electrically connect with the active component of at least one of the plurality of devices. In some embodiments, the recessed portion of the shielding structure is absent from the molding.

In some embodiments, a system in package (SiP) includes a plurality of devices; a shielding structure defined with a plurality of compartments, at least one of the plurality of devices is disposed within one of the plurality of compartments; a molding disposed around the plurality of devices and the shielding structure; and a redistribution layer (RDL) disposed over a plurality of active components of the plurality of devices and the molding adjacent to the plurality of active components of the plurality of devices, wherein the shielding structure includes a plurality of recessed portions, and each of the plurality of recessed portions is recessed towards the RDL.

In some embodiments, the shielding structure is extended vertical to the RDL. In some embodiments, the shielding structure is electrically connected with the RDL. In some embodiments, at least one of the plurality of the recessed portions of the shielding structure is absent from the molding.

In some embodiments, a method of manufacturing a semiconductor structure includes disposing a plurality of devices on a carrier; disposing a shielding structure on the carrier; encapsulating the plurality of devices and the shielding structure by a molding; and removing the carrier from the plurality of devices and the shielding structure, wherein the molding includes a first surface adjacent to an active component of at least one of the plurality of devices and a second surface opposite to the first surface, and the shielding structure includes a first surface adjacent to the first surface of the molding and a second surface adjacent to the second surface of the molding, and the second surface of the shielding structure includes a recessed portion recessed towards the first surface of the molding.

In some embodiments, the method further includes removing a portion of the molding disposed within the recessed portion by laser drilling operations. In some embodiments, the encapsulating the plurality of devices and the shielding structure includes transfer molding operations or compression molding operations. In some embodiments, the method further includes disposing a metallic coating conformal to the recessed portion of the second surface of the shielding structure. In some embodiments, the method further includes disposing a metallic coating conformal to the second surface of the shielding structure, the second surface of the molding and second surfaces of the plurality of devices adjacent to the second surface of the molding. In some embodiments, the method further includes disposing a redistribution layer (RDL) over the first surface of the molding and first surfaces of the plurality of devices adjacent to the first surface of the molding.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
    a plurality of devices;
    a molding surrounding the plurality of devices and including a first surface adjacent to an active component of at least one of the plurality of devices and a second surface opposite to the first surface; and
    a shielding structure disposed within the molding and between two or more of the plurality of devices;
    wherein the shielding structure includes a first surface adjacent to the first surface of the molding and a second surface adjacent to the second surface of the molding, and the second surface of the shielding structure includes a recessed portion recessed towards the first surface of the molding, and
    a metallic coating disposed over the molding and the shielding structure, wherein the metallic coating extends substantially conformally and continuously within the recessed portion of the second surface of the shielding structure.

2. The semiconductor structure of claim 1, wherein the recessed portion of the second surface of the shielding structure is disposed adjacent to the second surface of the molding.

3. The semiconductor structure of claim 1, wherein the recessed portion of the second surface of the shielding structure includes a height extended towards the first surface of the molding, and the height is substantially greater than about 50 um.

4. The semiconductor structure of claim 1, wherein the recessed portion of the second surface of the shielding structure includes a width substantially parallel to the second surface of the molding, and the width is substantially greater than about 100 um.

5. The semiconductor structure of claim 1, wherein the metallic coating is disposed conformal to the recessed portion of the second surface of the shielding structure.

6. The semiconductor structure of claim 1, wherein the metallic coating is disposed conformal to the second surface of the shielding structure, the second surface of the molding and surfaces of the plurality of devices adjacent to the second surface of the molding.

7. The semiconductor structure of claim 1, wherein the metallic coating includes solder.

8. The semiconductor structure of claim 1, wherein one of the plurality of devices has a substantially different height from another one of the plurality of devices.

9. The semiconductor structure of claim 1, wherein the plurality of devices includes at least one unpackaged device and at least one packaged device, or the plurality of devices includes a bare chip, a die, a ball grid array (BGA) package, a quad flat no leads (QFN) package, a land grid array (LGA) package, a surface mount device (SMD) or a microelectromechanical systems (MEMS) device.

10. The semiconductor structure of claim 1, wherein the recessed portion of the shielding structure is free from coverage of the molding in a cross-sectional view.

11. A system in package (SiP), comprising:
a plurality of devices;
a shielding structure defined with a plurality of compartments, at least one of the plurality of devices is disposed within one of the plurality of compartments;
a molding disposed around the plurality of devices and the shielding structure; and
a redistribution layer (RDL) disposed over a plurality of active components of the plurality of devices and the molding adjacent to the plurality of active components of the plurality of devices and
a metallic coating disposed over the molding and the shielding structure,
wherein the shielding structure includes a plurality of recessed portions, and each of the plurality of recessed portions is recessed towards the RDL, and the metallic coating is disposed within the plurality of recessed portions of the shielding structure.

12. The system in package of claim 11, wherein the shielding structure is extended vertical to the RDL.

13. The system in package of claim 11, wherein the shielding structure is electrically connected with the RDL.

14. The system in package of claim 11, wherein the plurality of recessed portions of the shielding structure are free from coverage of the molding in a cross-sectional view.

15. A semiconductor structure, comprising:
a first device;
a second device disposed adjacent to the first device;
a shielding structure disposed between the first device and the second device;
a molding encapsulating the first device, the second device and the shielding structure; and
a metallic coating disposed over a surface of the molding, wherein the shielding structure includes a recessed portion recessed into the shielding structure, a portion of the metallic coating is disposed within and interfaced with the recessed portion.

16. The semiconductor structure of claim 15, wherein the portion of the metallic coating is surrounded by the molding.

17. The semiconductor structure of claim 15, wherein the shielding structure and the metallic coating are conductive.

18. The semiconductor structure of claim 15, wherein a height of the shielding structure is substantially greater than a height of the first device and a height of the second device.

19. The semiconductor structure of claim 15, wherein a thickness of the shielding structure is substantially same as a thickness of the portion of the metallic coating.

20. The semiconductor structure of claim 15, wherein the portion of the metallic coating is in a triangular, quadrilateral, polygonal or tapered shape.

* * * * *